United States Patent
Ishida

(10) Patent No.: US 11,074,089 B2
(45) Date of Patent: Jul. 27, 2021

(54) SWITCH STATE DETERMINING DEVICE

(71) Applicant: Rohm Co., Ltd., Kyoto (JP)

(72) Inventor: Hiroyoshi Ishida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 417 days.

(21) Appl. No.: 15/614,864

(22) Filed: Jun. 6, 2017

(65) Prior Publication Data

US 2017/0357517 A1    Dec. 14, 2017

(30) Foreign Application Priority Data

Jun. 9, 2016   (JP) .............................. JP2016-115402

(51) Int. Cl.
| | | |
|---|---|---|
| G06F 9/448 | (2018.01) | |
| H03K 17/18 | (2006.01) | |
| G01R 21/00 | (2006.01) | |
| G01R 21/133 | (2006.01) | |

(52) U.S. Cl.
CPC ......... *G06F 9/4494* (2018.02); *G01R 21/006* (2013.01); *G01R 21/133* (2013.01); *H03K 17/18* (2013.01)

(58) Field of Classification Search
CPC ... G06F 9/4494; G06F 21/006; G01R 21/006; G01D 21/00

See application file for complete search history.

(56) References Cited

U.S. PATENT DOCUMENTS

| | | | | |
|---|---|---|---|---|
| 2010/0014195 A1* | 1/2010 | Takahashi | .......... | H03K 17/0822 361/18 |
| 2010/0085675 A1* | 4/2010 | Oki | .......... | H02M 1/08 361/101 |
| 2011/0206208 A1* | 8/2011 | Augustyn | .......... | H04B 15/00 381/1 |
| 2013/0229186 A1* | 9/2013 | Shiraishi | .......... | G01R 31/327 324/415 |

(Continued)

FOREIGN PATENT DOCUMENTS

| | | |
|---|---|---|
| JP | H9-46199 A | 2/1997 |
| JP | 2006-080869 | 3/2006 |

(Continued)

OTHER PUBLICATIONS

Japanese Patent Office; Office Action mailed in Japanese Patent Application No. 2016-115402 with English-language translation (dated Feb. 5, 2020).

*Primary Examiner* — Manuel A Rivera Vargas
(74) *Attorney, Agent, or Firm* — Fish & Richardson P.C.

(57) ABSTRACT

A switch state determining device, includes: an external terminal to which a switch is externally attached; a constant current generating part configured to generate a constant current and flow the constant current through the external terminal; a voltage comparing part configured to compare a terminal voltage of the external terminal with a threshold voltage to generate a comparison signal; an ON/OFF determining part configured to output an ON/OFF determination signal of the switch depending on the comparison signal; a (Continued)

threshold voltage control part configured to adjust the threshold voltage depending on a threshold voltage set value; and a level determining part configured to output a level determination signal of the terminal voltage or a terminal voltage value.

18 Claims, 22 Drawing Sheets

(56) References Cited

U.S. PATENT DOCUMENTS

| | | | |
|---|---|---|---|
| 2013/0245869 A1* | 9/2013 | Nishida | ................ B60L 3/0069 |
| | | | 701/22 |
| 2015/0120004 A1* | 4/2015 | Jimi | ................... G05B 19/0423 |
| | | | 700/21 |
| 2015/0162747 A1* | 6/2015 | Iwasaki | ................... H02H 9/02 |
| | | | 361/90 |

FOREIGN PATENT DOCUMENTS

| | | |
|---|---|---|
| JP | 2009-70771 A | 4/2009 |
| JP | 2010-140364 A | 6/2010 |
| JP | 2011-081449 A | 4/2011 |

* cited by examiner

SWITCH STATE DETERMINING DEVICE

CROSS-REFERENCE TO RELATED APPLICATION

This application is based upon and claims the benefit of priority from Japanese Patent Application No. 2016-115402, filed on Jun. 9, 2016, the entire contents of which are incorporated herein by reference.

TECHNICAL FIELD

The present disclosure relates to a switch state determining device.

BACKGROUND

In the related art, a switch state determining device for determining the ON/OFF state of a switch externally attached to an external terminal by comparing a terminal voltage of the external terminal with a predetermined threshold voltage has been used in various applications (e.g., a vehicle-mounted device).

However, the related art switch state determining device may erroneously determine the ON/OFF state of a switch when a level of a terminal voltage of the external terminal is unintentionally changed due to aged deterioration of the switch.

SUMMARY

The present disclosure provides some embodiments of a switch state determining device which hardly makes an erroneous determination due to aged deterioration.

According to one embodiment of the present disclosure, there is provided a switch state determining device, including: an external terminal to which a switch is externally attached; a constant current generating part configured to generate a constant current and flow the constant current through the external terminal; a voltage comparing part configured to compare a terminal voltage of the external terminal with a threshold voltage to generate a comparison signal; an ON/OFF determining part configured to output an ON/OFF determination signal of the switch depending on the comparison signal; a threshold voltage control part configured to adjust the threshold voltage depending on a threshold voltage set value; and a level determining part configured to output a level determination signal of the terminal voltage or a terminal voltage value (first configuration).

In the switch state determining device having the first configuration, the level determining part may be configured to output the level determination signal or the terminal voltage value in response to a request (second configuration).

In the switch state determining device having the first configuration, the level determining part may be configured to autonomously output the level determination signal or the terminal voltage value (third configuration).

In the switch state determining device having any one of the first to third configurations, the constant current generating part may include a first current source connected between the external terminal and a power source terminal and a second current source connected between the external terminal and a ground terminal, and wherein the first current source may be driven when an ON/OFF determination of a switch externally attached between the external terminal and the ground terminal is performed and the second current source may be driven when an ON/OFF determination of a switch externally connected between the external terminal and the power source terminal is performed (fourth configuration).

In the switch state determining device having any one of the first to fourth configurations, the level determining part may include: an analog-to-digital (A/D) conversion part configured to convert the terminal voltage into the terminal voltage value; a terminal voltage value register configured to store the terminal voltage value; an abnormality detection value register configured to store an abnormality detection value; and a comparison part configured to compare the terminal voltage value with the abnormality detection value to generate the level determination signal (fifth configuration).

In the switch state determining device having the fifth configuration, the level determining part may further include a selector configured to select one terminal voltage from a plurality of external terminals and output the selected terminal voltage to the A/D conversion part (sixth configuration).

According to another embodiment of the present disclosure, there is provided an electronic device, including: a switch; the switch state determining device having any one of the first to sixth configurations; and a microcomputer configured to monitor the ON/OFF determination signal (seventh configuration).

In the electronic device having the seventh configuration, the microcomputer may be configured to change the threshold voltage set value in a stepwise manner depending on the level determination signal, or calculate the threshold voltage set value depending on the terminal voltage value (eighth configuration).

According to still another embodiment of the present disclosure, there is provided an electronic device, including: a switch; the switch state determining device having any one of the fifth or sixth configuration; and a microcomputer configured to monitor the ON/OFF determination signal, wherein the microcomputer is configured to change both the threshold voltage set value and the abnormality detection value in a stepwise manner depending on the level determination signal, or calculate both the threshold voltage set value and the abnormality detection value depending on the terminal voltage value (ninth configuration).

According to a further embodiment of the present disclosure, there is provided a vehicle including the electronic device having any one of the seventh to ninth configurations (tenth configuration).

DETAILED DESCRIPTION

Embodiments of the present disclosure will be now described in detail with reference to the drawings.
<Electronic Device>

Figure 1:
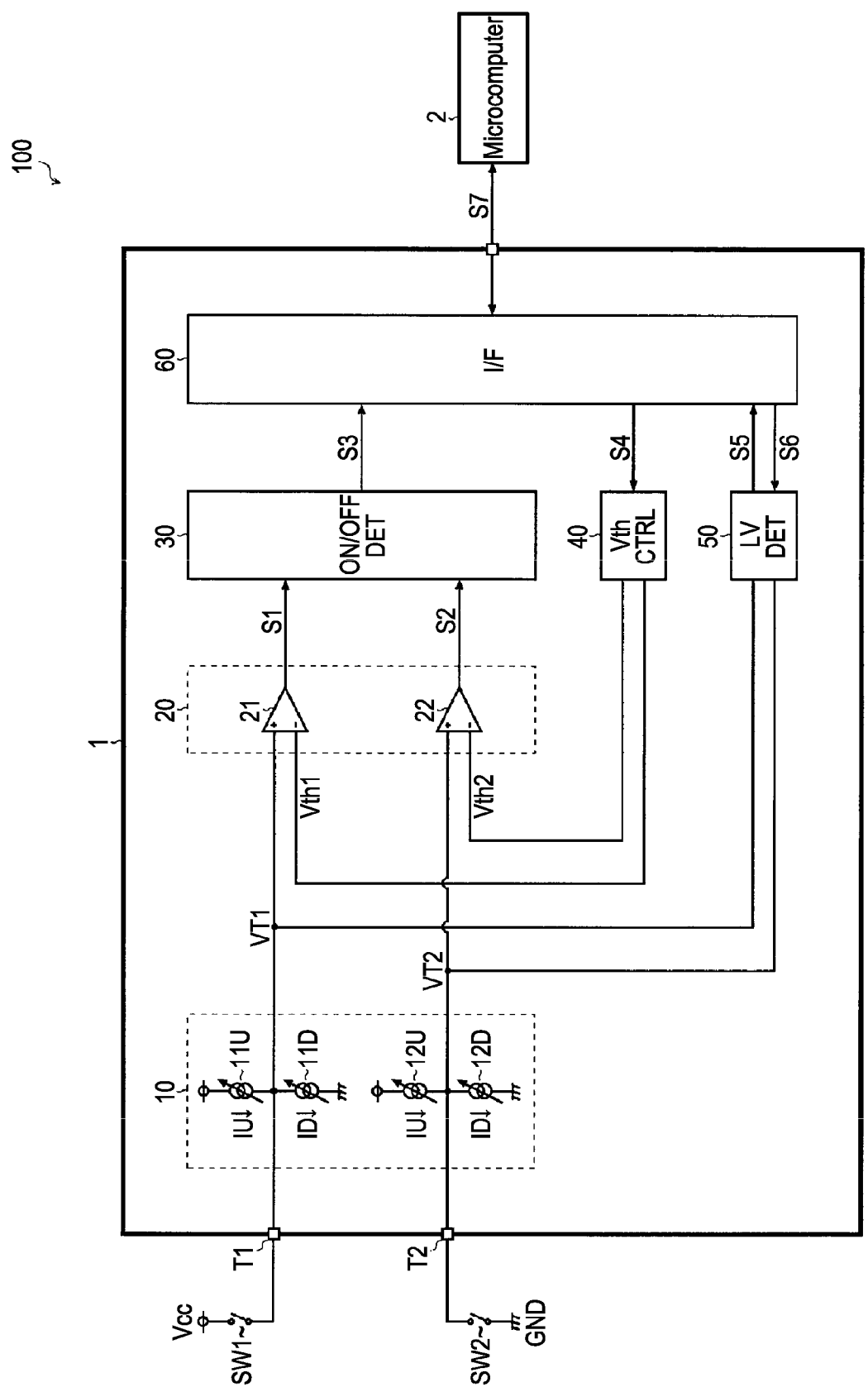
FIG. 1 is a block diagram illustrating an overall configuration of an electronic device.

FIG. 1 is a block diagram illustrating an overall configuration of an electronic device. An electronic device 100 of this configuration example includes a switching state determining device 1, a microcomputer 2, and switches SW1 and SW2.

The switch state determining device 1 is a semiconductor integrated circuit (IC) device which determines the ON/OFF state (=close/open determination) of the switches SW1 and SW2 externally attached to external terminals T1 and T2 of the switch state determining device 1, respectively, and notifies the microcomputer 2 about a determination result. In addition to the ON/OFF determination of the switches SW1 and SW2, the switch state determining device 1 also has a function of determining if there is an abnormality in the switches SW1 and SW2. This will be described in detail later.

The microcomputer 2, which is a control subject of the electronic device 100, may instruct the switch state determining device 1 to determine a state (=ON/OFF determination or abnormality determination) of the switches SW1 and SW2 via serial communication or interruption notification, and execute various operations based on a determination result.

The switch SW1 is a Vcc side switch externally attached between the external terminal T1 and an application terminal (=power source terminal) of a source voltage Vcc. On the other hand, the switch SW2 is a GND side switch externally attached between the external terminal T2 and an application terminal (=ground terminal) of a ground voltage GND.
<Switch State Determining Device>

Next, a configuration and an operation of the switch state determining device 1 will be described with reference to FIG. 1. The switch state determining device 1 of this configuration example includes the external terminals T1 and T2, a constant current generating part 10, a voltage comparing part 20, an ON/OFF determining part 30, a threshold voltage control part 40, a level determining part 50, and an interface part 60.

The external terminals T1 and T2 are pins for externally attaching the switches SW1 and SW2, respectively. In the example of FIG. 1, the switch SW1 on the VCC side is externally attached to the external terminal T1, and the switch SW2 on the GND side is externally attached to the external terminal T2. However, the type (VCC side/GND side) of the switches externally attached to the external terminals T1 and T2 is not limited to the example of FIG. 1 and the GND side switch may be externally attached to the external terminal T1 or the Vcc side switch may be externally attached to the external terminal T2. Also, in the example of FIG. 1, the number of external terminals is two for the convenience of illustration, but the number of external terminals may be one or more.

The constant current generating part 10 is a circuit part for generating a constant current to flow through each of the external terminals T1 and T2 when determining the ON/OFF state of the switches SW1 and SW2, and includes current sources 11U and 12U and current sources 11D and 12D.

The current sources 11U and 12U are pull-up side current sources connected between a power source terminal and the external terminals T1 and T2, respectively, and generate a constant current IU to flow from the power source terminal toward the external terminals T1 and T2.

The current sources 11D and 12D are pull-down side current sources connected between the external terminals T1 and T2 and a ground terminal, respectively, and generate a constant current ID to flow from the external terminals T1 and T2 toward the ground terminal.

The constant current generating part 10 having the above configuration drives the pull-down side current source when determining the ON/OFF state of the Vcc side switch, and drives the pull-up side current source when determining the ON/OFF state of the GND side switch. For example, the current source 11D is driven when determining the ON/OFF state of the switch SW1, and the current source 12U is driven when determining the ON/OFF state of the switch SW2. As a result, terminal voltages VT1 and VT2 corresponding to ON/OFF of the switches SW1 and SW2 appear at the external terminals T1 and T2, respectively.

As described above, if both the pull-up side current sources 11U and 12U and the pull-down side current sources 11D and 12D are installed for the external terminals T1 and T2, it becomes possible to properly perform ON/OFF determination of the switches, regardless of the type (Vcc side/GND side) of the switches externally attached to the external terminals T1 and T2.

A set of pull-up side current source and pull-down side current source may be installed at each of the external terminals. That is to say, when the number of external terminals is n, n sets of pull-up side current sources and pull-down side current sources may be installed.

However, when the type (Vcc side/GND side) of switches externally attached to the external terminals T1 and T2 is limited in advance, appropriate pull-up side current sources 11U and 12U and the pull-down side current sources 11D and 12D may be omitted. For example, when only the Vcc side switches are externally attached to both of the external terminals T1 and T2, the pull-up side current sources 11U and 12U are unnecessary. Conversely, when only the GND side switches are externally attached to both of the external terminals T1 and T2, the pull-down side current sources 11D and 12D are unnecessary.

The voltage comparing part 20 is a circuit part for comparing the terminal voltages VT1 and VT2 with threshold voltages Vth1 and Vth2, respectively, to generate comparison signals S1 and S2, and includes comparators 21 and 22.

The comparator 21 compares the terminal voltage VT1 input to a non-inverting input terminal (+) with the threshold voltage Vth1 input to an inverting input terminal (−) to generate the comparison signal S1. The comparison signal S1 has a high level when the terminal voltage VT1 is higher than the threshold voltage Vth1 and has a low level when the terminal voltage VT1 is lower than the threshold voltage Vth1.

The comparator 22 compares the terminal voltage VT2 input to a non-inverting input terminal (+) with the threshold voltage Vth2 input to an inverting input terminal (−) to generate the comparison signal S2. The comparison signal S2 has a high level when the terminal voltage VT2 is higher than the threshold voltage Vth2 and has a low level when the terminal voltage VT2 is lower than the threshold voltage Vth2.

One comparator may be installed at each of the external terminals. That is to say, when the number of external terminals is n, n number of comparators may be installed.

The ON/OFF determining part 30 outputs an ON/OFF determination signal S3 depending on the comparison signals S1 and S2. For example, when the number of external terminals is n, the ON/OFF determination signal S3 may be an n-bit digital signal. By generating such a signal, it is possible to match each digit value (0 or 1) of the ON/OFF determination signal S3 and an ON/OFF determination result of each switch in a one-to-one manner.

The threshold voltage control part 40 adjusts the threshold voltages Vth1 and Vth2 depending on a threshold voltage set value S4 input from the microcomputer 2 via the interface part 60.

The level determining part 50 generates a level determination signal S5 (or a terminal voltage value) indicating whether the terminal voltages VT1 and VT2 are within a normal range, and outputs the same to the microcomputer 2 via the interface part 60. Further, the level determining part 50 also has a function to reflect an abnormality detection value S6 input from the microcomputer 2 via the interface part 60 in the level determination processing.

The interface part 60 transmits and receives a serial communication signal S7 to and from the microcomputer 2. Further, data contained in the serial communication signal S7 may include the ON/OFF determination signal S3, the threshold voltage set value S4, the level determination signal S5, the abnormality detection value S6, and the like. However, the interface part 60 is not an essential component, and the above signals or data values may be transmitted or received using, for example, a general input/output port or a dedicated port (interrupt port).

<Threshold Voltage Control Part>

Figure 2:
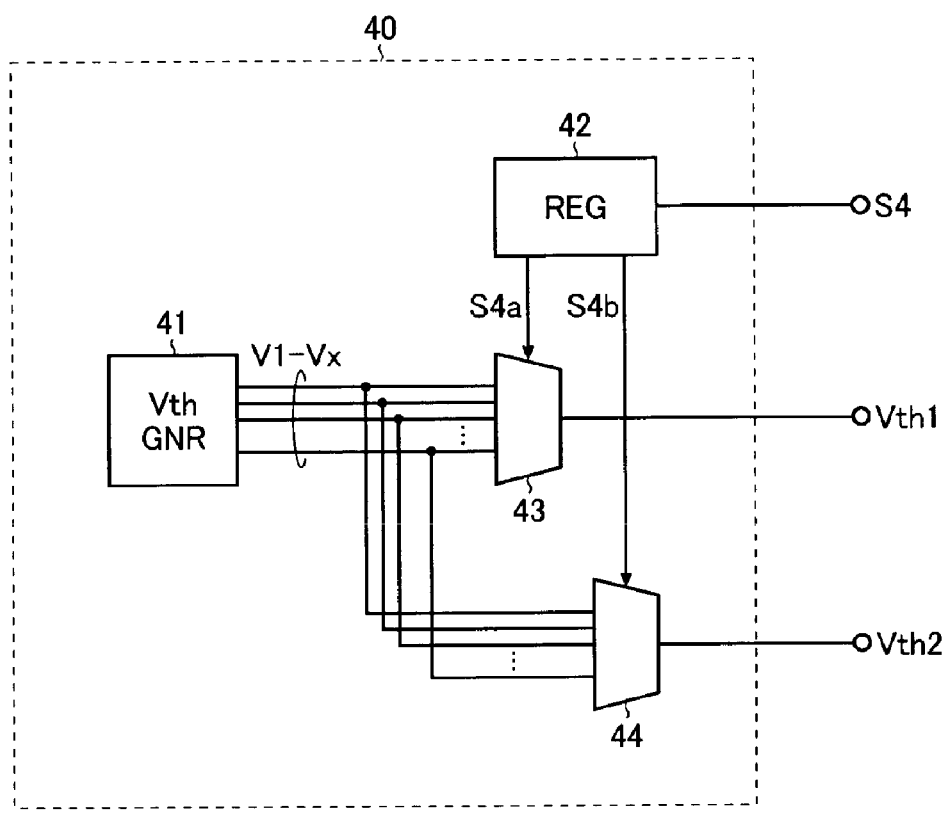
FIG. 2 is a block diagram illustrating a configuration example of a threshold voltage control part.

FIG. 2 is a block diagram illustrating a configuration example of the threshold voltage control part 40. The threshold voltage control part 40 of this configuration example includes a gradation voltage generating part 41, a threshold voltage set value register 42, and selectors 43 and 44.

The gradation voltage generating part 41 generates x number of gradation voltages V1 to Vx. As the gradation voltage generating part 41, a resistance ladder for dividing the source voltage Vcc into x number of voltages, or the like may be used.

The threshold voltage set value register 42 stores the threshold voltage set value S4 (here, threshold voltage set values S4$a$ and S4$b$ for two channels) input from the microcomputer 2 via the interface part 60.

The selector 43 selects one of the gradation voltages V1 to Vx depending on the threshold voltage set value S4$a$ and outputs the selected gradation voltage as the threshold voltage Vth1.

The selector 44 selects one of the gradation voltages V1 to Vx depending on the threshold voltage set value S4$b$ and outputs the selected gradation voltage as the threshold voltage Vth2.

<Level Determining Part>

Figure 3:
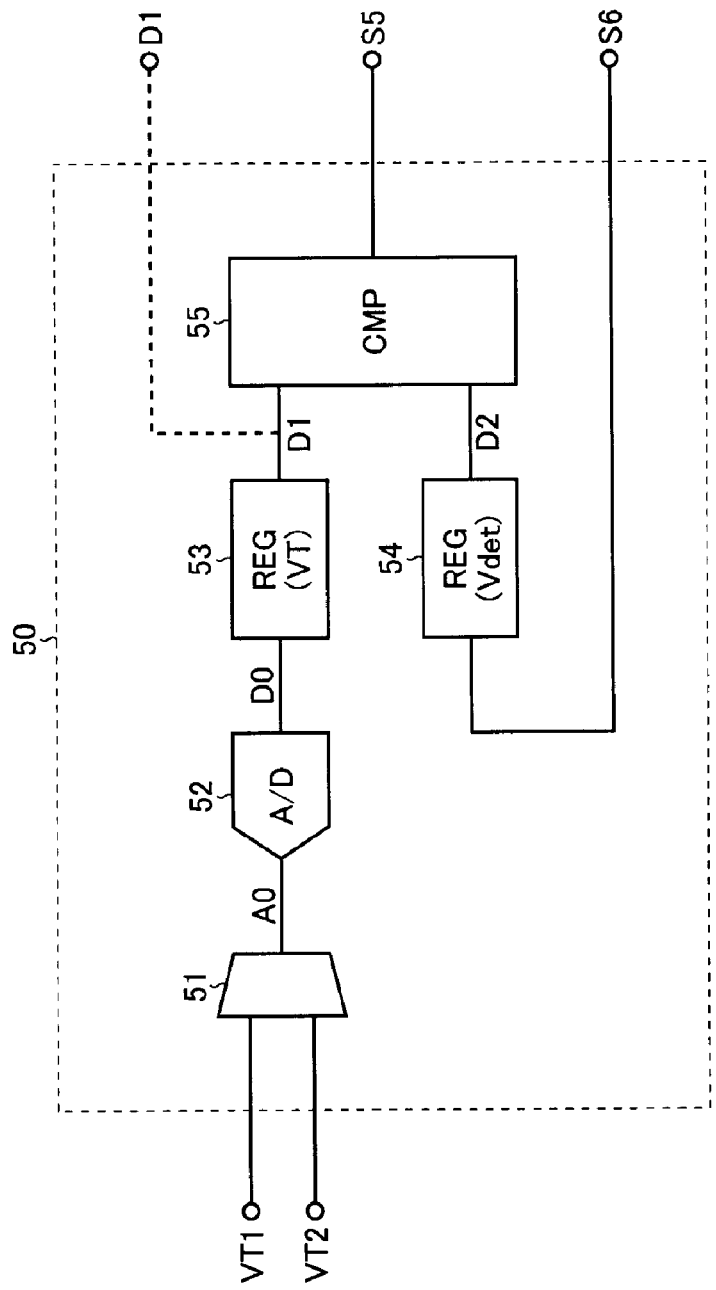
FIG. 3 is a block diagram illustrating a configuration example of a level determining part.

FIG. 3 is a block diagram illustrating a configuration example of the level determining part 50. The level determining part 50 of this configuration example includes a selector 51, an A/D conversion part 52, a terminal voltage value register 53, an abnormality detection value register 54, and a comparison part 55.

The selector 51 selects one of the terminal voltages VT1 and VT2 and outputs the selected terminal voltage as an analog voltage A0 to the A/D conversion part 52. By installing such a selector 51, it is not necessary to increase the number of the A/D conversion part 52 depending on the number n of the external terminals, which prevents an increase in chip size. When the number of external terminals is one, the selector 51 may be omitted.

The A/D conversion part 52 converts the analog voltage A0 (i.e., the terminal voltage selected by the selector 51) into a digital terminal voltage value D0.

The terminal voltage value register 53 stores the terminal voltage value D0 of each of the external terminals T1 and T2. As the terminal voltage value D0, terminal voltage values VT1 (on) and VT2 (on) respectively detected when the switches SW1 and SW2 are turned on, terminal voltage values VT1 (*off*) and VT2 (*off*) respectively detected when the switches SW1 and SW2 are turned off, or both of them are stored.

The abnormality detection value register 54 stores the abnormality detection value S6 input from the microcomputer 2 via the interface part 60. As the abnormality detection value S6, at least one of abnormality detection values Vdet1H and Vdet1L for use in determining a level of the switch SW1 and at least one of abnormality detection values Vdet2H and Vdet2L for use in determining a level of the switch SW2 are stored.

The comparison part 55 compares a terminal voltage value D1 stored in the terminal voltage value register 53 with an abnormality detection value D2 stored in the abnormality detection value register 54, and generates the level determination signal S5.

The level determining part 50 of this configuration example outputs the level determination signal (or the terminal voltage value D1) to the microcomputer 2 via the interface part 60.

<ON/OFF Determining Operation>

Figure 4:
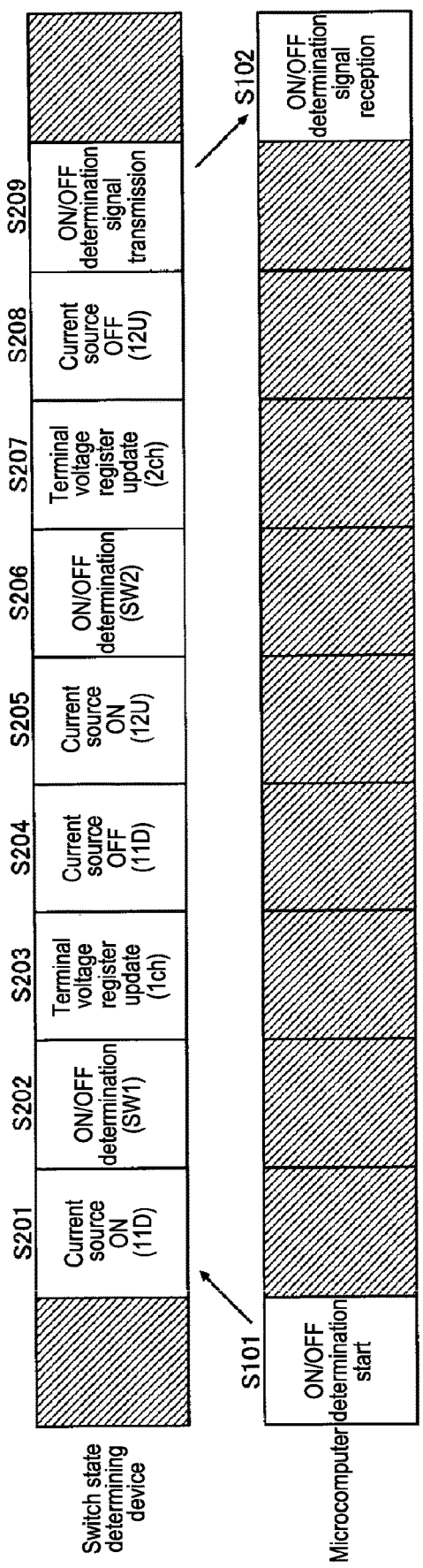
FIG. 4 is a time chart illustrating an example of an ON/OFF determining operation.

FIG. 4 is a time chart illustrating an example of an ON/OFF determining operation. The upper part of FIG. 4 illustrates operation steps of the switch state determining device 1, and the lower part of FIG. 4 illustrates operation steps of the microcomputer 2. In FIG. 4, the operation steps of the microcomputer 2 are numbered in the 100s, and the operation steps of the switch state determining device 1 are numbered in the 200s.

When an ON/OFF determining operation of the switches SW1 and SW2 starts, an ON/OFF determination start command is transmitted from the microcomputer 2 at step S101.

When the ON/OFF determination start command is received by the switch state determining device 1, the current source 11D is first turned on at step S201. Next, at step S202, the terminal voltage VT1 is compared with the threshold voltage Vth1 and ON/OFF determination of the switch SW1 is performed. Further, at step S203, A/D conversion processing of the terminal voltage VT1 and update processing (i.e., overwriting of the terminal voltage value VT1 (on) or VT1 (off)) of the terminal voltage value register 53 are properly performed. Thereafter, at step S204, the current source 11D is turned off.

Subsequently, at step S205, the current source 12U is turned on. And then, at step S206, the terminal voltage VT2 is compared with the threshold voltage Vth2 and ON/OFF determination processing of the switch SW2 is performed. Further, at step S207, A/D conversion processing of the terminal voltage VT2 and update processing (i.e., overwriting of the terminal voltage value VT2 (on) or VT2 (off)) of the terminal voltage value register 53 are properly performed. Thereafter, at step S208, the current source 12U is turned off.

After the ON/OFF determination of each of the switches SW1 and SW2 is performed, an ON/OFF determination signal S3 is transmitted from the switch state determining device 1 at step S209.

Finally, at step S102, the ON/OFF determination signal S3 is received by the microcomputer 2, and the series of ON/OFF determination operations are completed.

In the time chart of FIG. 4, the ON/OFF determination of the switches SW1 and SW2 is sequentially performed in a time-division manner, but the control sequence is not limited thereto in any way. For example, if the current sources 11D and 12U are simultaneously turned on and the terminal voltages VT1 and VT2 are simultaneously compared with the threshold voltages Vth1 and Vth2, respectively, the ON/OFF determination of the switches SW1 and SW2 may be simultaneously performed in parallel. However, since there is only one A/D conversion part 52, the A/D conversion processing of the terminal voltages VT1 and VT2 and the update processing of the terminal voltage value register 53 are sequentially performed in a time-division manner. In the time chart of FIG. 4, a configuration in which the ON/OFF determining operation is performed in response to every ON/OFF determination start command from the microcomputer 2 is taken as an example. However, in addition to this configuration, for example, it may be configured such that the switch state determining device 1 itself intermittently monitors the switch state and notifies the microcomputer 2 when an ON/OFF state is changed.

<Register Setting Operation and Level Determining Operation>

Figure 5:
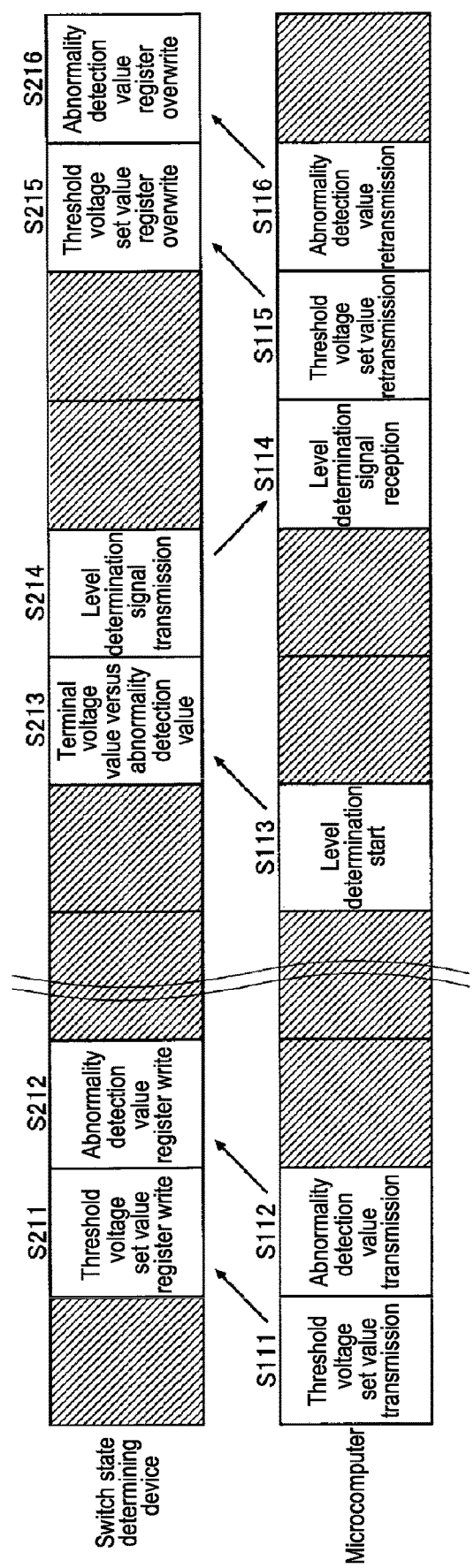
FIG. 5 is a time chart illustrating an example of a register setting operation and a level determining operation.

FIG. 5 is a time chart illustrating an example of a register setting operation and a level determining operation. The upper part of FIG. 5 illustrates operation steps of the switch state determining device 1, and the lower part of FIG. 5 illustrates operation steps of the microcomputer 2. In FIG. 5, the operation steps of the microcomputer 2 are numbered in the 110s, and the operation steps of the switch state determining device 1 are numbered in the 210s.

First, initial setting operations (steps S111 and S112 and steps S211 and S212) of the threshold voltage set value register 42 and the abnormality detection value register 54 will be described.

At step S111, the threshold voltage set value S4 (i.e., an initial set value or a finally updated value when a previous operation completes) is transmitted from the microcomputer 2. When the threshold voltage set value S4 is received by the switch state determining device 1, setting of the threshold voltage set value register 42 (i.e., write processing of the threshold voltage set value S4) is performed at step S211.

At step S112, the abnormality detection value S6 (i.e., an initial set value or a finally updated value when a previous operation completes) is transmitted from the microcomputer 2. When the abnormality set value S6 is received by the switch state determining device 1, setting of the abnormality detection value register 54 (=write processing of the abnormality detection value S6) is performed at step S212.

The initial setting operation of the threshold voltage set value register 42 and the abnormality detection value register 54 described above may be performed when the electronic device 100 starts, or the like.

Next, an operation of determining a level of the terminal voltages VT1 and VT2 (steps S113, S114, S213, and S214) will be described.

When the operation of determining a level of the terminal voltages VT1 and VT2 starts, a level determination start command is transmitted from the microcomputer 2 at step S113.

When the level determination start command is received by the switch state determining device 1, at step S213, a terminal voltage value D1 and an abnormality detection value D2 are compared for each of the terminal voltages VT1 and VT2 and a level determination signal S5 is generated based on a comparison result. Thereafter, at step S214, the level determination signal S5 is transmitted from the switch state determining device 1. Instead of the level determination signal S5 or together with the level determination signal S5, the terminal voltage value D1 may also be transmitted.

And then, at step S114, the level determination signal S5 is received by the microcomputer 2 and the series of level determination operations are completed. Further, when it is determined that at least one of the terminal voltages VT1 and VT2 is not within a normal range depending on the level determination signal S5, the microcomputer 2 continues to perform an operation of resetting the threshold voltage set value register 42 and the abnormality detection value register 54.

Next, an operation of resetting the threshold voltage set value register 42 and the abnormality detection value register 54 (steps S115, S116, S215, and S216) will be described.

At step S115, the threshold voltage set value S4 (i.e., a reset value) is transmitted from the microcomputer 2. When the threshold voltage set value S4 is received by the switch state determining device 1, resetting of the threshold voltage set value register 42 (overwrite processing of the threshold voltage set value S4) is performed at step S215. With the configuration of resetting the threshold voltage set value register 42 in this manner, it is difficult to erroneously determine ON/OFF of the switches SW1 and SW2 although the terminal voltages VT1 and VT2 are unintentionally changed in level due to aged deterioration of the switches SW1 and SW2.

At step S116, the abnormality detection value S6 (i.e., a reset value) is transmitted from the microcomputer 2. When the abnormality detection value S6 is received by the switch state determining device 1, resetting of the abnormality detection value register 54 (overwrite processing of the abnormality detection value S6) is performed at step S216. As described above, with the configuration of not only resetting the threshold voltage set value register 42 but also resetting the abnormality detection value register 54, since determination processing of a level of the terminals VT1 and VT2 (abnormality detection processing) may be continuously performed even after the threshold voltage set value S4 is reset, it is also possible to cope with further aged deterioration of the switches SW1 and SW2.

In the time chart of FIG. 5, the switch state determining device 1 (in particular, the level determining part 50) receives the level determination start command input from the microcomputer 2, performs an operation of determining a level of the terminal voltages VT1 and VT2, and outputs a level determination signal S5 (or the terminal voltage value D1) as an example. However, the control sequence is not limited thereto in any way.

For example, it may be configured such that the switch state determining device 1 (in particular, the level determining part 50) regularly performs an operation of determining a level of the terminal voltages VT1 and VT2 and autonomously outputs the level determination signal S5 (or the terminal voltage value D1). Further, it may be configured such that the microcomputer 2 is notified only when the terminal voltages VT1 and VT2 are not within the normal range.

Moreover, when it is determined that at least one of the terminal voltages VT1 and VT2 is not within the normal range, the microcomputer 2 may perform a user a notification operation or various abnormality protection operations (forcible completion, etc.), instead of the register resetting operation or together with the register resetting operation.

In addition, the register resetting function of the microcomputer 2 may be handed over to the switch state determining device 1 so that the switch state determining device 1 may autonomously complete the level determining operation and the register resetting operation described above, without having to wait for an instruction from the microcomputer 2.

Hereinafter, the switch state determining operation (the ON/OFF determining operation and the level determining operation) described above will be described in detail based on specific embodiments by way of example.

First Embodiment

Figure 6:
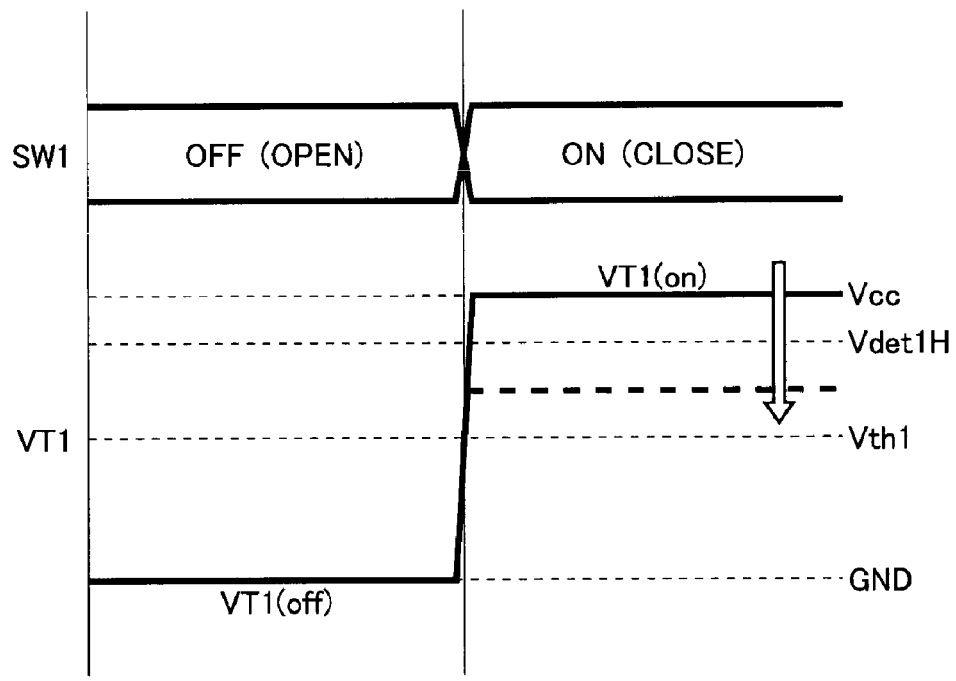
FIG. 6 is a schematic diagram illustrating an operation of determining a state of a power source side switch in a first embodiment of the present disclosure.

FIG. 6 is a schematic diagram illustrating an operation of determining a state of the switch SW1 in a first embodiment of the present disclosure. In FIG. 6, an ON/OFF state of the switch SW1 is illustrated in the upper part, and a behavior of the terminal voltage VT1 is illustrated in the lower part.

First, an operation of determining the ON/OFF state of the switch SW1 will be described. In this embodiment, the ON/OFF state of the switch SW1 is determined by comparing the terminal voltage VT1 with the threshold voltage Vth1. An initial set value of the threshold voltage Vth1 may be, for example, Vth1=Vcc/2.

When the switch SW1 is in an OFF state, the terminal voltage VT1 is pulled down to the ground voltage GND (or its approximate value) via the current source 11D, and thus, the terminal voltage VT1 becomes lower than the threshold voltage Vth1.

On the other hand, when the switch SW1 is in an ON state, the terminal voltage VT1 is pulled up to the source voltage Vcc (or its approximate value) via the switch SW1, and thus, the terminal voltage VT1 becomes higher than the threshold voltage Vth1.

Thus, it is possible to determine ON/OFF of the switch SW1 by comparing the terminal voltage VT1 with the threshold voltage Vth1.

Next, an operation of determining a level of the terminal voltage VT1 will be described. In this embodiment, a level of the terminal voltage VT1 is determined by comparing a terminal voltage value VT1 (on) detected when the switch SW1 is turned on with a predetermined abnormality detection value Vdet1H. An initial set value of the abnormality detection value Vdet1H may be, for example, Vth1<Vdet1H<Vcc.

When there is no abnormality in the switch SW1, the terminal voltage value VT1 (on) is equal to the source voltage Vcc (or its approximate value), and thus, the terminal voltage value VT1 (on) becomes higher than the abnormality detection value Vdet1H (see the thick solid line in FIG. 6).

On the other hand, when an abnormality (contact failure or the like) causing an increase in an ON resistance value occurs in the switch SW1, the terminal voltage value VT1 (on) does not rise to the source voltage Vcc. Then, as the abnormality progresses, the terminal voltage value VT1 (on) eventually falls below the abnormality detection value Vdet1H (see the thick broken line in FIG. 6).

Thus, it is possible to determine a level of the terminal voltage VT1 by comparing the terminal voltage value VT1 (on) with the abnormality detection value Vdet1H (abnormality determination). In particular, if the abnormality detection value Vdet1H is set to be higher than the threshold voltage Vth1, it is possible to recognize abnormality of the terminal voltage VT1 before ON/OFF of the switch SW1 is erroneously determined.

Further, when abnormality of the terminal voltage VT1 (VT1(on)<Vdet1H) is detected, the microcomputer 2 steps down the threshold voltage Vth1 and the abnormality detection value Vdete1H. With this configuration, it is possible to continue the processing of determining a level of the terminal voltage VT1 (abnormality detection processing), while avoiding an erroneous determination of the ON/OFF state of the switch SW1 in advance.

Figure 7:
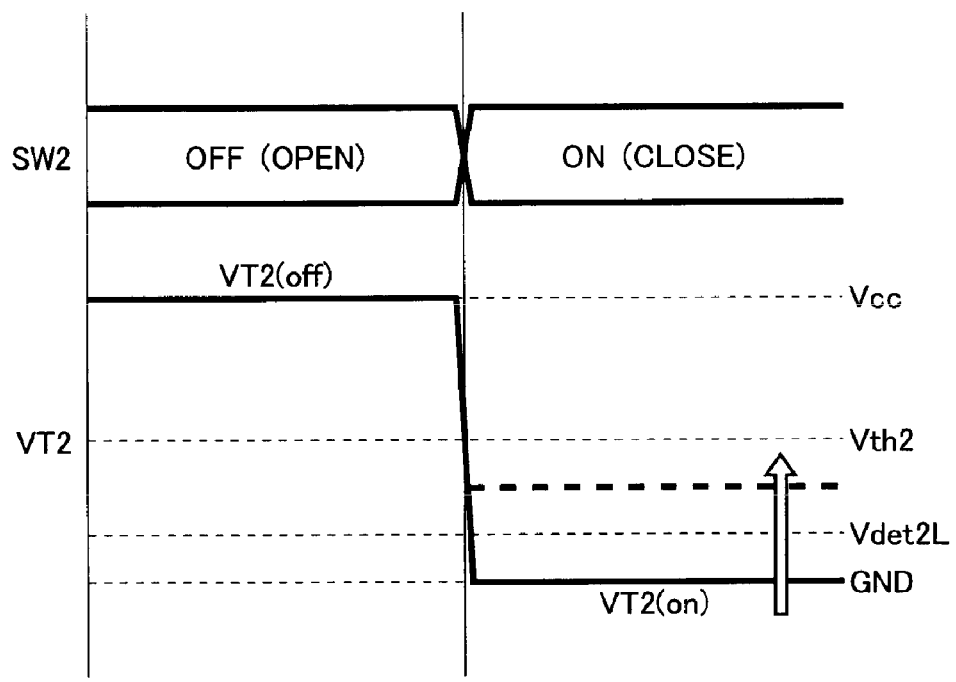
FIG. 7 is a schematic diagram illustrating an operation of determining a state of a GND side switch in the first embodiment.

FIG. 7 is a schematic diagram illustrating an operation of determining a state of the switch SW2 in the first embodiment. In FIG. 7, an ON/OFF state of the switch SW2 is illustrated in the upper part, and a behavior of the terminal voltage VT2 is illustrated in the lower part.

First, an operation of determining the ON/OFF state of the switch SW2 will be described. In this embodiment, the ON/OFF state of the switch SW2 is determined by comparing the terminal voltage VT2 with the threshold voltage Vth2. An initial set value of the threshold voltage Vth2 may be, for example, Vth2=Vcc/2.

When the switch SW2 is in an OFF state, the terminal voltage VT2 is pulled up to the source voltage Vcc (or its approximate value) via the current source 12U, and thus, the terminal voltage VT2 becomes higher than the threshold voltage Vth2.

On the other hand, when the switch SW2 is in an ON state, the terminal voltage VT2 is pulled down to the ground voltage GND (or its approximate value) via the switch SW2, and thus, the terminal voltage VT2 becomes lower than the threshold voltage Vth2.

Thus, it is possible to determine the ON/OFF state of the switch SW2 by comparing the terminal voltage VT2 with the threshold voltage Vth2.

Next, an operation of determining a level of the terminal voltage VT2 will be described. In this embodiment, a level of the terminal voltage VT2 is determined by comparing a terminal voltage value VT2 (on) detected when the switch SW2 is turned on with a predetermined abnormality detection value Vdet2L. An initial set value of the abnormality detection value Vdet2L may be, for example, GND<Vdet2L<Vth2.

When there is no abnormality in the switch SW2, the terminal voltage value VT2 (on) is equal to the ground voltage GND (or its approximate value), and thus, the terminal voltage value VT2 (on) becomes lower than the abnormality detection value Vdet2L (see the thick solid line in the drawing).

On the other hand, when an abnormality (contact failure or the like) causing an increase in an ON resistance value occurs in the switch SW2, the terminal voltage value VT2 (on) does not fall to the ground voltage GND. Then, as the abnormality progresses, the terminal voltage value VT2 (on) eventually exceeds the abnormality detection value Vdet2L (see the thick broken line in the drawing).

Thus, it is possible to determine a level of the terminal voltage VT2 by comparing the terminal voltage value VT2 (on) with the abnormality detection value Vdet2L (abnormality determination). In particular, if the abnormality detection value Vdet2L is set to be lower than the threshold voltage Vth2, it is possible to recognize abnormality of the terminal voltage VT2 before ON/OFF of the switch SW2 is erroneously determined.

Further, when abnormality of the terminal voltage VT2 (VT2(on)>Vdet2L) is detected, the microcomputer 2 steps up the threshold voltage Vth2 and the abnormality detection value Vdete2L. With this configuration, it is possible to continue the processing of determining a level of the terminal voltage VT2 (abnormality detection processing), while avoiding erroneous determination of ON/OFF of the switch SW2 in advance.

Figure 8:
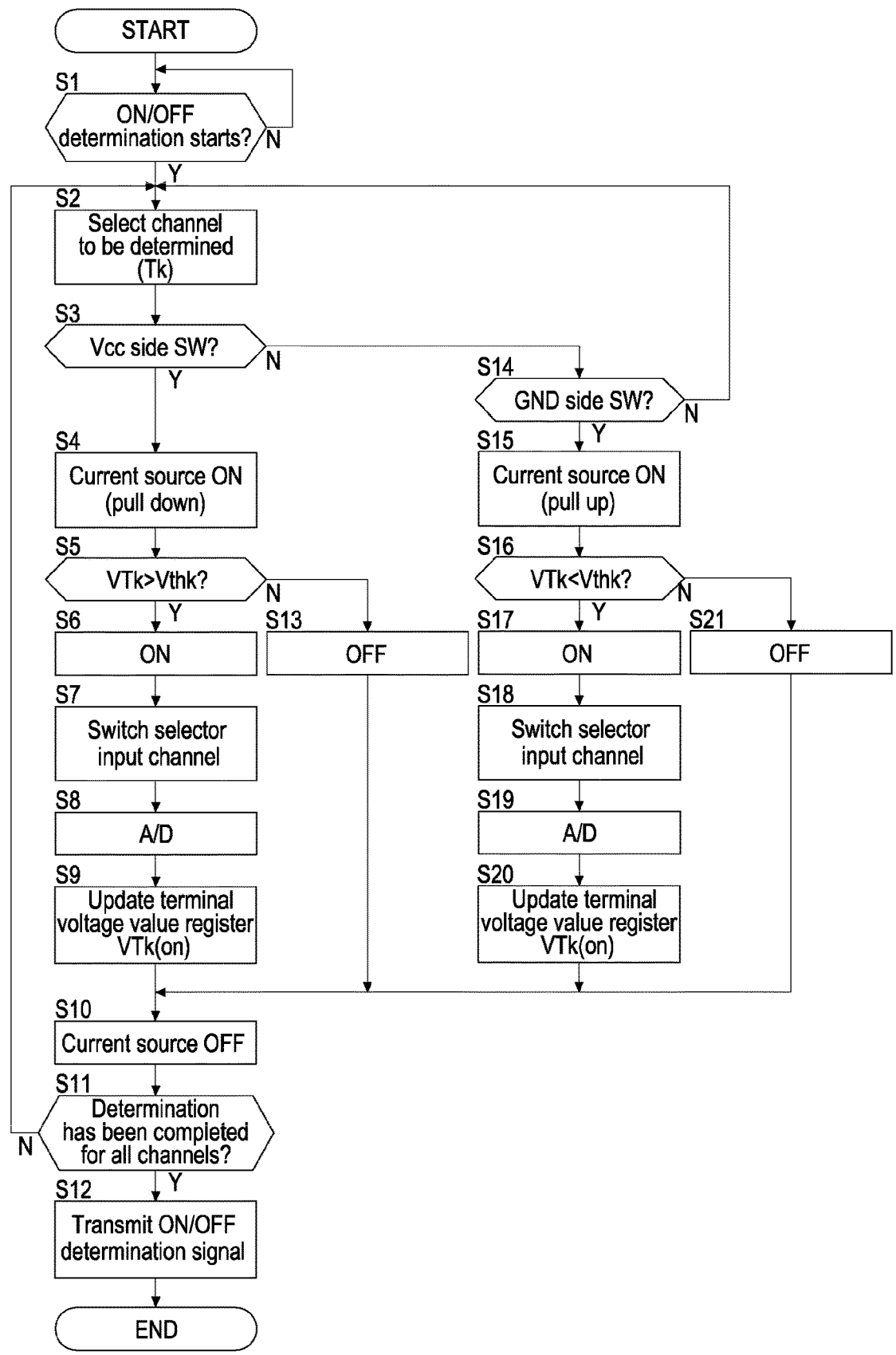
FIG. 8 is a flowchart illustrating an ON/OFF determining operation in the first embodiment.

FIG. 8 is a flowchart illustrating an ON/OFF determining operation in the first embodiment. It is assumed that an operation subject of this flow is the switch state determining device 1 unless otherwise mentioned.

First, at step S1, it is determined whether an ON/OFF determination start command is input from the microcomputer 2. Here, in the case of YES at step S1, the flow proceeds to step S2. On the other hand, in the case of NO, the flow returns to step S1 where an input standby state of the ON/OFF determination start command continues.

In the case of YES at step S1, a kth external terminal Tk (where k=1, 2, . . . , n) is selected as a determination target channel at step S2. At step S2, an initial value of k may be set to 1, and each time the flow returns to step S2, k may be incremented by 1.

Subsequently, at step S3, it is determined whether a Vcc side switch is externally attached to the external terminal Tk. Here, in the case of YES, the flow proceeds to step S4, and in the case of NO, the flow proceeds to step S14. The type (Vcc side/GND side) of a switch externally attached to the external terminal Tk may be stored in advance in a predetermined register (not shown in FIG. 1).

In the case of YES at step S3, a pull-down side current source of the constant current generating part 10 is turned on at step S4.

Subsequently, at step S5, it is determined whether a terminal voltage VTk is higher than a threshold voltage Vthk. Here, in the case of YES, the flow goes to step S6, and in the case of NO, the flow goes to step S13.

In the case of YES at step S5, an ON/OFF determination result indicating that the Vcc side switch is ON is obtained at step S6.

Subsequently, at steps S7 to S9, it is informed that the Vcc side switch is ON and register update processing is performed by the level determining part 50. Specifically, input channel switching processing (i.e., selective output processing of the terminal voltage VTk) of the selector 51, A/D conversion processing (i.e., generation processing of the terminal voltage value VTk (on)) of the terminal voltage VTk by the A/D conversion part 52, and update processing of the terminal voltage value register 53 (i.e., storage processing of the terminal voltage value VTk (on)) are sequentially performed.

Thereafter, at step S10, the pull-down side current source of the constant current generating part 10 is turned off and ON/OFF determination processing of one channel is completed.

Subsequently, at step S11, it is determined whether the ON/OFF determination processing of a switch for every channel (all of the external terminals T1 to Tn) has been completed. Here, in the case of YES, the flow proceeds to step S12. On the other hand, in the case of NO, the flow returns to step S2 and the ON/OFF determination processing of a next channel continues.

In the case of YES at step S11, an ON/OFF determination signal S3 containing ON/OFF determination results of all the channels is transmitted to the microcomputer 2 at step S12 and the series of ON/OFF determination operations are completed.

On the other hand, in the case of NO at step S5, an ON/OFF determination result indicating that the Vcc side switch is OFF is obtained at step S13, and thereafter, the flow skips to step S10. That is to say, when the Vcc side switch is OFF, the ON/OFF determination processing of one channel is completed, without performing the register update processing of the level determining part 50.

Further, in the case of NO at step S3, it is determined whether a GND side switch is externally attached to the external terminal Tk at step S14. Here, in the case of YES, the flow proceeds to step S15. On the other hand, in the case of NO, since the external terminal Tk is not in use (=neither the Vcc side switch nor the GND side switch is externally attached to the external terminal Tk), the flow returns to step S2 and the ON/OFF determination processing of a next channel continues.

In the case of YES at step S14, the pull-up side current source of the constant current generating part 10 is turned on at step S15.

Subsequently, at step S16, it is determined whether the terminal voltage VTk is lower than the threshold voltage Vthk. Here, in the case of YES, the flow goes to step S17, and in the case of NO, the flow goes to step S21.

In the case of YES at step S16, an ON/OFF determination result indicating that the GND side switch is ON is obtained at step S17.

Subsequently, at steps S18 to S20, it is informed that the GND side switch is ON and the register update processing is performed by the level determining part 50. The operation of steps S18 to S20 is basically the same as that of steps S7 to S9. Thereafter, the flow proceeds to step S10 where the ON/OFF determination processing of one channel is completed.

On the other hand, in the case of NO at step S16, an ON/OFF determination result indicating that the GND side switch is OFF is obtained at step S21, and thereafter, the flow skips to step S10. That is to say, when the GND side switch is OFF, the ON/OFF determination processing of one channel is completed, without performing the register update processing of the level determining part 50.

Figure 9:
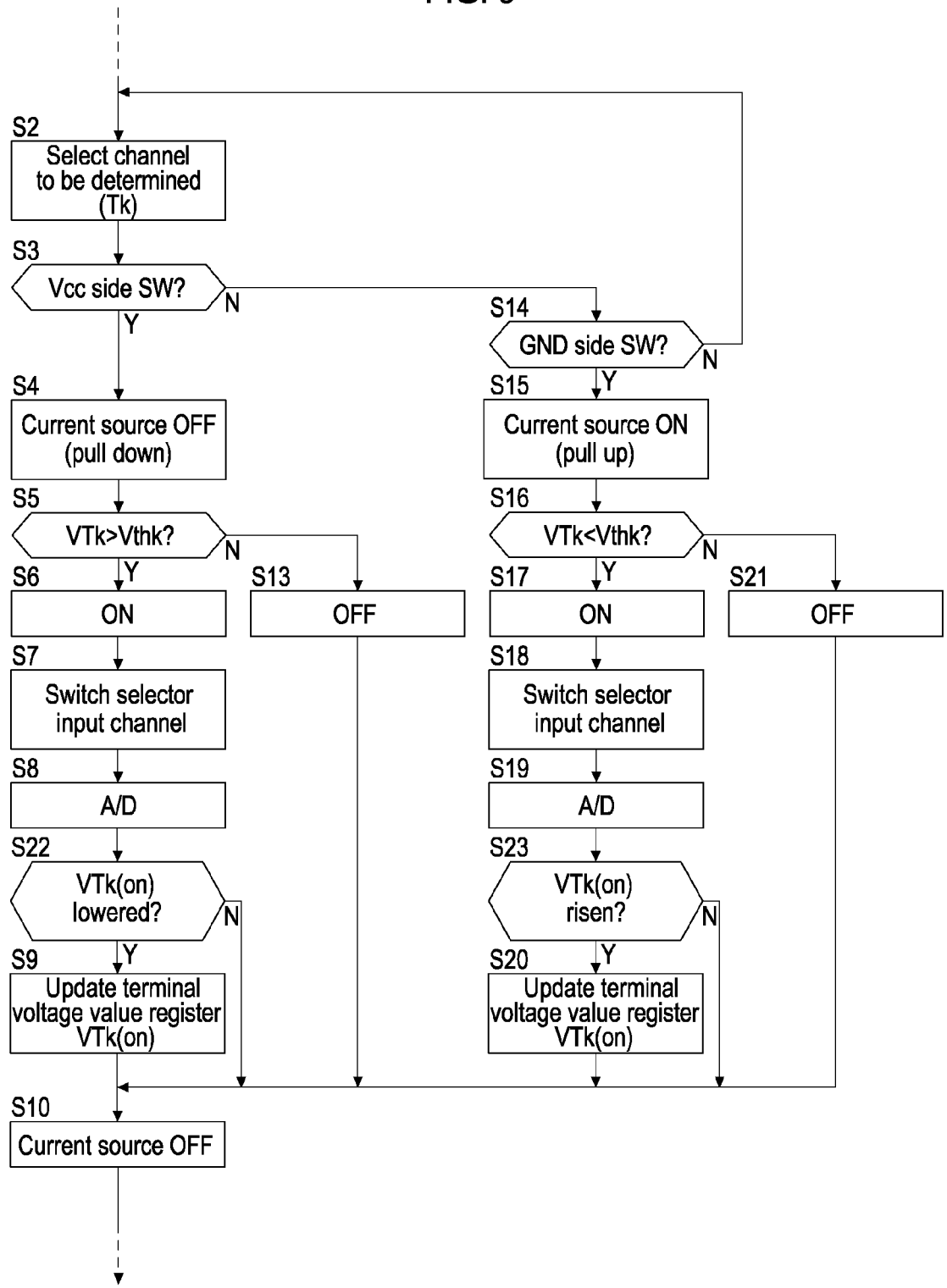
FIG. 9 is a flowchart illustrating a modification of a register updating operation in the first embodiment.

FIG. 9 is a flowchart illustrating a modification of a register updating operation in the first embodiment. The flowchart of FIG. 9 is characterized in that it additionally includes steps S22 and S23, based on the flowchart of FIG. 8. Thus, the same steps as those described above will be denoted by the same reference numerals as those of FIG. 8 and redundant descriptions thereof will be omitted. Hereinafter, description will be focused on characteristic parts of this modification.

After it is informed that the Vcc side switch is ON and the flow reaches step S8 where A/D conversion processing of the terminal voltage VTk is performed, it is determined whether the terminal voltage value VTk (on) has lowered (i.e., whether the terminal voltage value VTk (on) approaches the abnormality detection value VdetkH) at step S22.

In the above determination processing, a new terminal voltage value VTk (on)-NEW, which is newly generated in the A/D conversion part 52, and an old terminal voltage value VTk (on)-OLD, which is read from the terminal voltage value register 53, are compared to determine whether the former is lower than the latter.

Here, in the case of YES, the flow proceeds to step S9 where the update processing of the terminal voltage value register 53 described above is performed. On the other hand, in the case of NO, the flow skips to step S10 where the ON/OFF determination processing of one channel is completed, without performing the update processing of the terminal voltage value register 53.

Further, after it is informed that the GND side switch is ON and the flow reaches step S19 where the A/D conversion processing of the terminal voltage VTk is performed, it is determined whether the terminal voltage value VTk (on) has risen (i.e., whether the terminal voltage value VTk (on) approaches the abnormality detection value VdetkL) at step S23.

In the above determination processing, a new terminal voltage value VTk (on)-NEW, which is newly generated in the A/D conversion part 52, and an old terminal voltage value VTk (on)-OLD, which is read from the terminal voltage value register 53, are compared to determine whether the former is higher than the latter.

Here, in the case of YES, the flow goes to step S20 where the update processing of the terminal voltage value register 53 described above is performed. On the other hand, in the case of NO, the flow skips to step S10 where the ON/OFF determination processing of one channel is completed, without performing the update processing of the terminal voltage value register 53.

As described above, the updating operation of the terminal voltage value register 53 may be performed only when the terminal voltage value VTk (on) approaches the abnormality detection value VdetkH or VdetkL.

Figure 10:
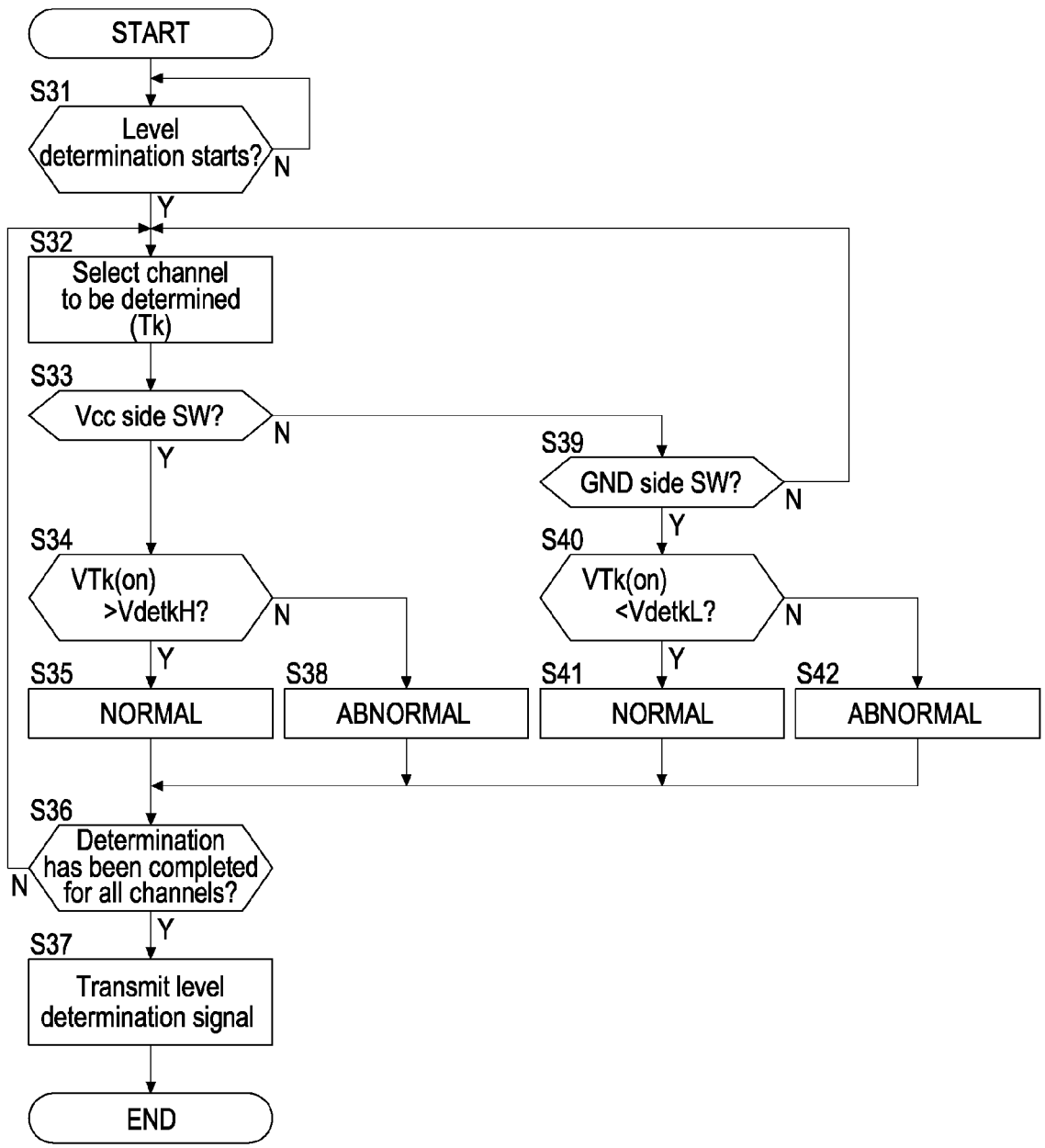
FIG. 10 is a flowchart illustrating a level determining operation in the first embodiment.

FIG. 10 is a flowchart illustrating a level determining operation in the first embodiment. An operation subject of this flow is the switch state determining device 1 unless otherwise mentioned.

First, at step S31, it is determined whether a level determination start command is input from the microcomputer 2. Here, in the case of YES, the flow goes to step S32. On the other hand, in the case of NO, the flow returns to step S31 where an input standby state of the level determination start command continues.

In the case of YES at step S31, a kth external terminal Tk (where k=1, 2, . . . , n) is selected as a determination target channel at step S32. Further, at step S32, an initial value of k may be set to 1, and each time the flow returns to step S32, k may be incremented by 1.

Subsequently, at step S33, it is determined whether a Vcc side switch is externally attached to the external terminal Tk. Here, in the case of YES, the flow goes to step S34, and in the case of NO, the flow goes to step S39.

In the case of YES at step S33, it is determined whether the terminal voltage value VTk (on) is greater than the abnormality detection value VdetkH at step S34. The determination processing at this step corresponds to, for example, the process of comparing the terminal voltage value VT1 (on) with the abnormality detection value VdetkH of FIG. 6. Here, in the case of YES, the flow goes to step S35, and in the case of NO, the flow goes to step S38.

In the case of YES at step S34, a level determination result indicating that the terminal voltage VTk is normal is obtained at step S35.

Subsequently, at step S36, it is determined whether the level determination processing of the terminal voltage VTk for every channel (all of the external terminals T1 to Tn) has been completed. Here, in the case of YES, the flow goes to step S37. On the other hand, in the case of NO, the flow returns to step S32 and the level determining of a next channel continues.

In the case of YES at step S36, a level determination signal S5 containing level determination results of the entire channels is transmitted to the microcomputer 2 at step S37 and the series of level determination operations are completed.

On the other hand, in the case of NO at step S34, a level determination result indicating that the terminal voltage VTk is not normal (i.e., abnormal) is obtained at step S38, and thereafter, the flow proceeds to step S36.

Further, in the case of NO at step S33, it is determined whether the GND side switch is externally attached to the external terminal Tk at step S39. Here, in the case of YES, the flow proceeds to step S40. On the other hand, in the case of NO, since the external terminal Tk is not in use, the flow returns to step S32 and the level determination processing of a next channel continues.

In the case of YES at step S39, it is determined whether the terminal voltage value VTk (on) is lower than the abnormality detection value VdetkL at step S40. The determination processing at this step corresponds to, for example, the process of comparing the terminal voltage value VT2 (on) with the abnormality detection value Vdet2L of FIG. 7. Here, in the case of YES, the flow proceeds to step S41, and in the case of NO, the flow proceeds to step S42.

In the case of YES at step S40, a level determination result indicating that the terminal voltage VTk is normal is obtained at step S41, and thereafter, the flow proceeds to step S36.

On the other hand, in the case of NO at step S40, a level determination result indicating that the terminal voltage VTk is not normal (i.e., abnormal) is obtained at step S42, and thereafter, the flow proceeds to step S36.

Second Embodiment

Figure 11:
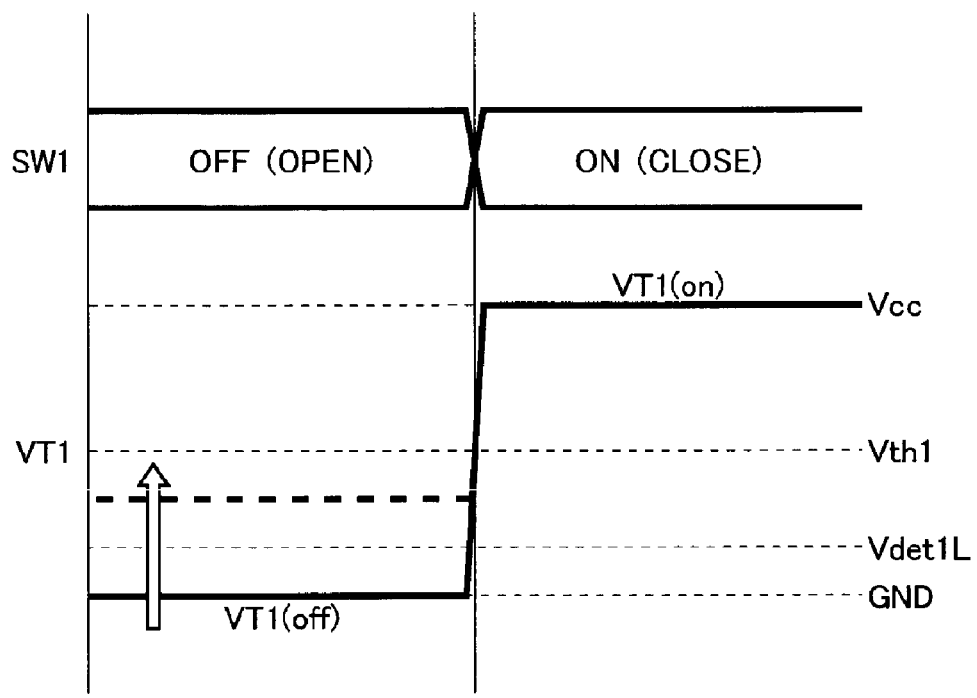
FIG. 11 is a schematic diagram illustrating an operation of determining a state of a power source side switch in a second embodiment of the present disclosure.

FIG. 11 is a schematic diagram illustrating an operation of determining a state of the switch SW1 in a second embodiment of the present disclosure. In FIG. 11, an ON/OFF state of the switch SW1 is illustrated in the upper part, and a behavior of the terminal voltage VT1 is illustrated in the lower part.

An operation of determining the ON/OFF state of the switch SW1 is similar to that of the first embodiment (FIG. 6) and thus redundant descriptions thereof will be omitted. Hereinafter, an operation of determining a level of the terminal voltage VT1 will be described. In this embodiment, unlike the first embodiment (FIG. 6), a level of the terminal voltage VT1 is determined by comparing the terminal voltage value VT1 (*off*) detected when the switch SW1 is turned off with a predetermined abnormality detection value Vdet1L. An initial set value of the abnormality detection voltage Vdet1L may be, for example, GND<Vdet1L<Vth1.

When there is no abnormality in the switch SW1, the terminal voltage value VT1 (*off*) is equal to the ground voltage GND (or its approximate value), and thus, the terminal voltage value VT1 (*off*) becomes lower than the abnormality detection value Vdet1L (see the thick solid line in the drawing).

On the other hand, when an abnormality (short-circuit failure or the like) causing an increase in a leak current value occurs in the switch SW1, the terminal voltage value VT1 (*off*) does not fall to the ground voltage GND. Then, as the abnormality progresses, the terminal voltage value VT1 (*off*) eventually exceeds the abnormality detection value Vdet1L (see the thick broken line in the drawing).

Thus, it is possible to determine a level of the terminal voltage VT1 by comparing the terminal voltage value VT1 (*off*) with the abnormality detection value Vdet1L (abnormality determination). In particular, if the abnormality detection value Vdet1L is set to be lower than the threshold voltage Vth1, it is possible to recognize abnormality of the terminal voltage VT1 before the ON/OFF state of the switch SW1 is erroneously determined.

Further, when abnormality of the terminal voltage VT1 (VT1(*off*)>Vdet1L) is detected, the microcomputer 2 steps up the threshold voltage Vth1 and the abnormality detection value Vdete1L. With this configuration, it is possible to continue the processing of determining a level of the terminal voltage VT1, while avoiding erroneous determination of the ON/OFF state of the switch SW1 in advance (abnormality detection processing).

Figure 12:
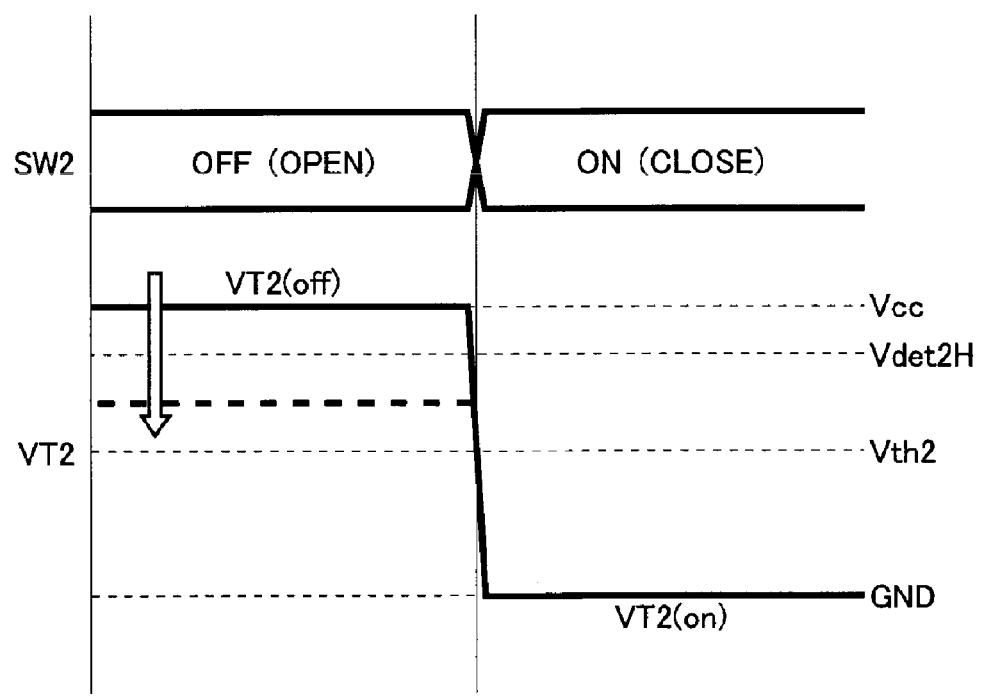
FIG. 12 is a schematic diagram illustrating an operation of determining a state of a GND side switch in the second embodiment.

FIG. 12 is a schematic diagram illustrating an operation of determining a state of the switch SW2 in the second embodiment. In FIG. 12, an ON/OFF state of the switch SW2 is illustrated in the upper part, and a behavior of the terminal voltage VT2 is illustrated in the lower part.

An operation of determining the ON/OFF state of the switch SW2 is similar to that of the first embodiment (FIG. 7) and thus redundant descriptions thereof will be omitted. Hereinafter, an operation of determining a level of the terminal voltage VT2 will be described. In this embodiment, unlike the first embodiment (FIG. 7), a level of the terminal voltage VT2 is determined by comparing the terminal voltage value VT2 (*off*) detected when the switch SW2 is turned off with a predetermined abnormality detection value Vdet2H. An initial set value of the abnormality detection voltage Vdet2H may be, for example, Vth2<Vdet2H<Vcc.

When there is no abnormality in the switch SW2, the terminal voltage value VT2 (*off*) is equal to the source voltage Vcc (or its approximate value), and thus, the terminal voltage value VT2 (*off*) becomes higher than the abnormality detection value Vdet2H (see the thick solid line in the drawing).

On the other hand, when an abnormality (short-circuit failure or the like) causing an increase in a leak current value occurs in the switch SW2, the terminal voltage value VT2 (*off*) does not rise to the source voltage Vcc. Then, as the abnormality progresses, the terminal voltage value VT2 (*off*) eventually falls below the abnormality detection value Vdet2H (see the thick broken line in the drawing).

Thus, it is possible to determine a level of the terminal voltage VT2 by comparing the terminal voltage value VT2 (*off*) with the abnormality detection value Vdet2H (abnormality determination). In particular, if the abnormality detection value Vdet2H is set to be higher than the threshold voltage Vth2, it is possible to recognize abnormality of the terminal voltage VT2 before the ON/OFF state of the switch SW1 is erroneously determined.

Further, when abnormality of the terminal voltage VT2 (VT2(*off*)<Vdet2H) is detected, the microcomputer 2 steps down the threshold voltage Vth2 and the abnormality detection value Vdete2H. With this configuration, it is possible to continue the processing of determining a level of the terminal voltage VT2, while avoiding erroneous determination of the ON/OFF state of the switch SW2 in advance (abnormality detection processing).

Figure 13:
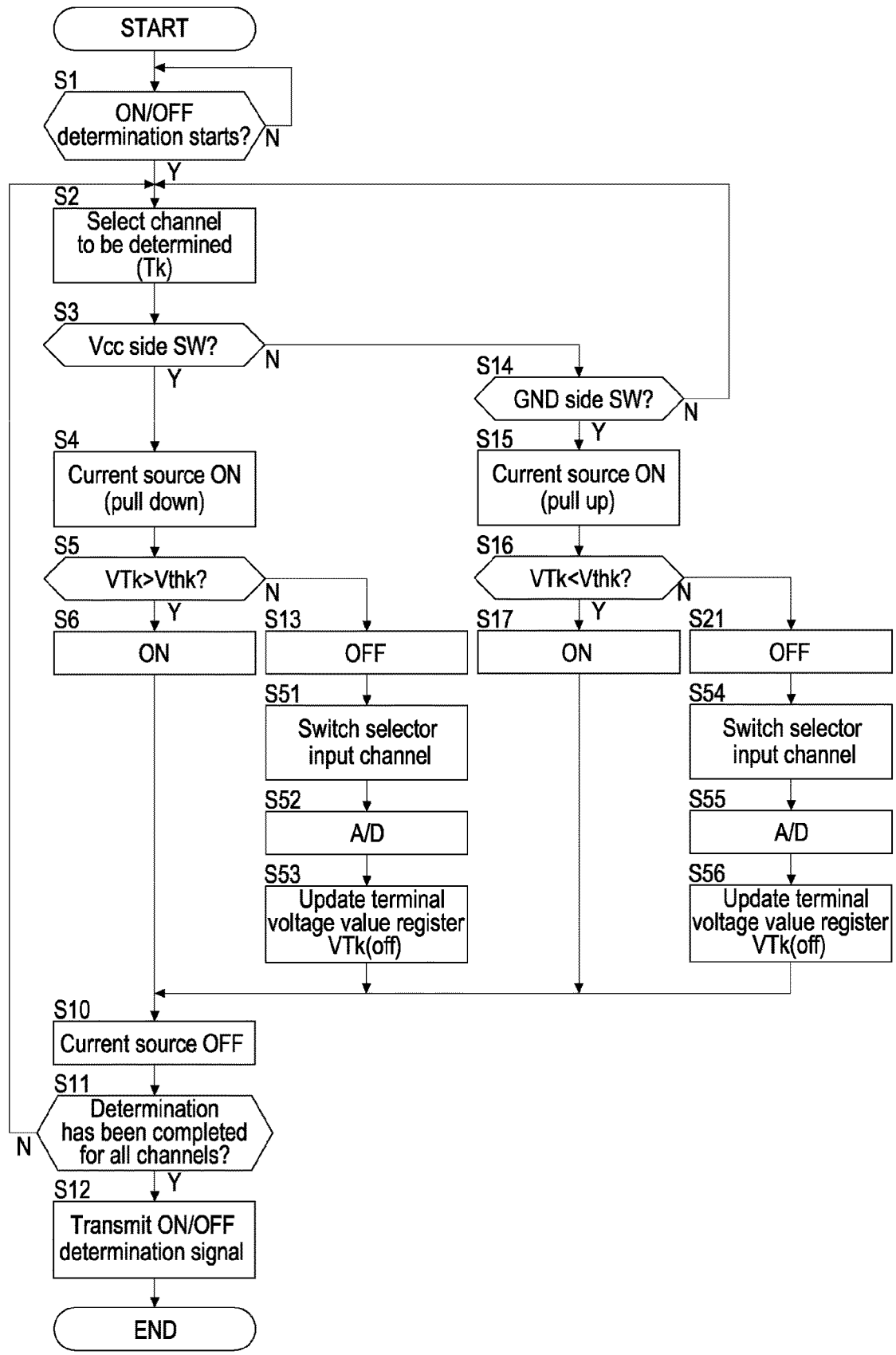
FIG. 13 is a flowchart illustrating an ON/OFF determining operation in the second embodiment.

FIG. 13 is a flowchart illustrating an ON/OFF determining operation in the second embodiment. The flowchart of FIG. 13 is characterized in that it additionally includes steps S51 to S56, without steps S7 to S9 and steps S18 to 20, based on the flowchart of FIG. 8. Thus, the same steps as those described above will be denoted by the same reference numerals as those of FIG. 8 and thus redundant descriptions thereof will be omitted. Hereinafter, description will be focused on characteristic parts of this modification.

In the case of YES at step S5, an ON/OFF determination result indicating that the Vcc side switch is ON is obtained at step S6 and, thereafter, the flow skips to step S10. On the other hand, in the case of NO at step S5, an ON/OFF determination result indicating that the Vcc side switch is OFF is obtained at step S13 and the update processing of the level determining part 50 is then performed at subsequent steps S51 to S53. Specifically, input channel switching processing (i.e., selective output processing of the terminal voltage VTk) of the selector 51, A/D conversion processing (i.e., generation processing of the terminal voltage value VTk (on)) of the terminal voltage VTk by the A/D conversion part 52, and update processing of the terminal voltage value register 53 (i.e., storage processing of the terminal voltage value VTk (on)) are sequentially performed, and thereafter, the flow proceeds to step S10.

Further, in the case of YES at step S16, an ON/OFF determination result indicating that the GND side switch is ON is obtained at step S17, and thereafter, the flow skips to step S10. On the other hand, in the case of NO at step S16, an ON/OFF determination result indicating that the GND side switch is OFF is obtained at step S21, and thereafter, register update processing of the level determining part 50 is performed at subsequent steps S54 to S56. The operation of steps S54 to S56 is basically the same as that of steps S51 to 53.

As described above, in the flow of FIG. 13, unlike the first embodiment (FIG. 8), register update processing of the level determining part 50 is performed only when it is determined that the Vcc side switch or the GND side switch is OFF.

Figure 14:
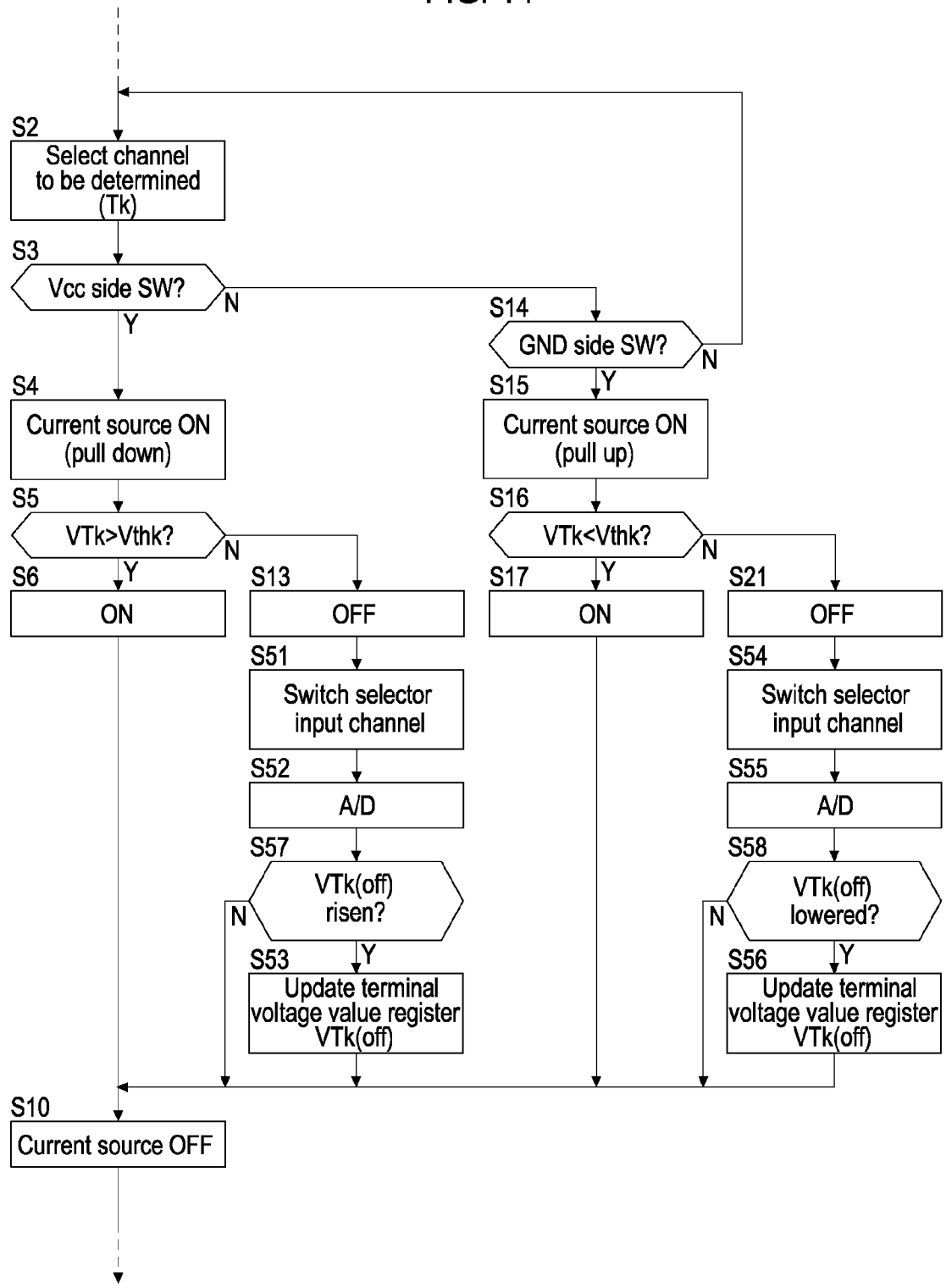
FIG. 14 is a flowchart illustrating a modification of a register updating operation in the second embodiment.

FIG. 14 is a flowchart illustrating a modification of a register updating operation in the second embodiment. The flowchart is characterized in that it additionally includes steps S57 and S58, based on the flowchart of FIG. 13. Thus, the same steps as those described above will be denoted by the same reference numerals as those of FIG. 13 and thus redundant descriptions thereof will be omitted. Hereinafter, description will be focused on characteristic parts of this modification.

After it is informed that the Vcc side switch is OFF and the flow reaches step S52 where the A/D conversion processing of the terminal voltage VTk is performed, it is determined whether the terminal voltage value VTk (off) has risen (i.e., whether the terminal voltage value VTk (off) approaches the abnormality detection value VdetkL) at step S57.

In the above determination processing, a new terminal voltage value VTk (off)-NEW, which is newly generated in the A/D conversion part 52, and an old terminal voltage value VTk (off)-OLD, which is read from the terminal voltage value register 53, may be compared to determine whether the former is higher than the latter.

Here, in the case of YES, the flow goes to step S53 where the update processing of the terminal voltage value register 53 described above is performed. On the other hand, in the case of NO, the flow skips to step S10 where the ON/OFF determination processing of one channel is completed, without performing the update processing of the terminal voltage value register 53.

In addition, after it is informed that the GND side switch is OFF and the flow reaches step S55 where the A/D conversion processing of the terminal voltage VTk is performed, it is determined whether the terminal voltage value VTk (off) has lowered (i.e., whether the terminal voltage value VTk (off) approaches the abnormality detection value VdetkH) at step S58.

In the above determination processing, a new terminal voltage value VTk (off)-NEW, which is newly generated in the A/D conversion part 52, and an old terminal voltage value VTk (off)-OLD, which is read from the terminal voltage value register 53, are compared to determine whether the former is lower than the latter.

Here, in the case of YES, the flow proceeds to step S56 where the update processing of the terminal voltage value register 53 described above is performed. On the other hand, in the case of NO, the flow skips to step S10 where the ON/OFF determination processing of one channel is completed, without the update processing of the terminal voltage value register 53.

As described above, the update processing of the terminal voltage value register 53 may be performed only when the terminal voltage value VTk (off) approaches the abnormality detection value VdetkH or VdetkL.

Figure 15:
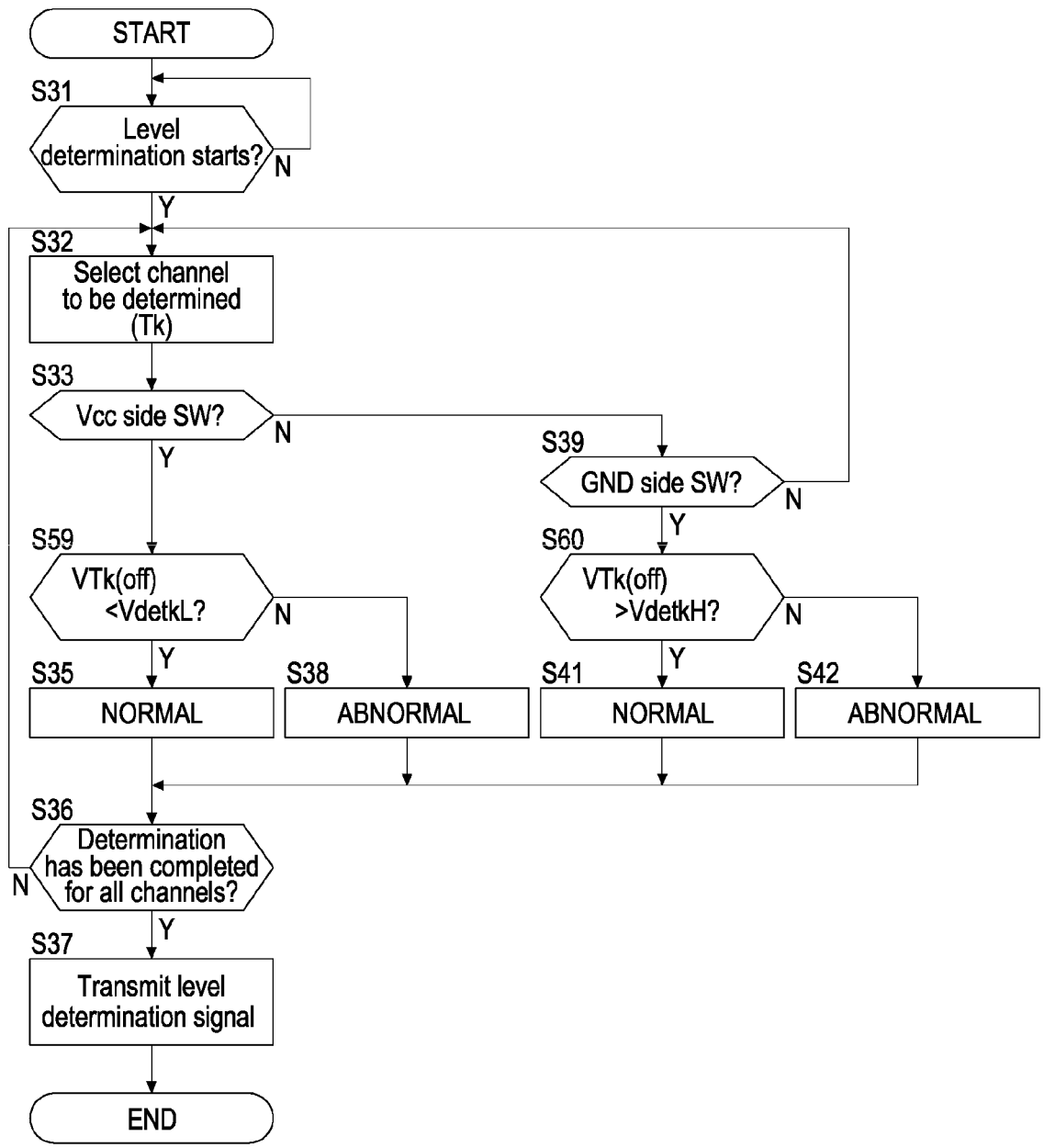
FIG. 15 is a flowchart illustrating a level determining operation in the second embodiment.

FIG. 15 is a flowchart illustrating a level determining operation in the second embodiment. The flowchart of FIG. 15 is characterized in that steps S34 and S40 are replaced with steps S59 and S60, respectively, based on the flowchart of FIG. 10. Thus, the same steps as those described above will be denoted by the same reference numerals as those of FIG. 10 and thus redundant descriptions thereof will be omitted. Hereinafter, description will be focused on characteristic parts of this modification.

In the case of YES at step S33, it is determined whether the terminal voltage value VTk (off) is lower than the abnormality detection value VdetkL at step S59. The determination processing at this step corresponds to, for example, the processing of comparing the terminal voltage value VT1 (off) with the abnormality detection value Vdet1L of FIG. 11. Here, in the case of YES, the flow proceeds to step S35 where a level determination result indicating that the terminal voltage VTk is normal is obtained. On the other hand, in the case of NO, the flow proceeds to step S38 where a level determination result indicating that the terminal voltage VTk is not normal (i.e., abnormal) is obtained.

In the case of YES at step S39, it is determined whether the terminal voltage value VTk (off) is higher than the abnormality detection value VdetkH at step S60. The determination processing at this step corresponds to, for example, the processing of comparing the terminal voltage value VT2 (off) with the abnormality detection value Vdet2H of FIG. 12. Here, in the case of YES, the flow proceeds to step S41 where a level determination result indicating that the terminal voltage VTk is normal is obtained. On the other hand, in the case of NO, the flow proceeds to step S42 where a level determination result indicating that the terminal voltage VTk is not normal (i.e., abnormal) is obtained.

Third Embodiment

Figure 16:
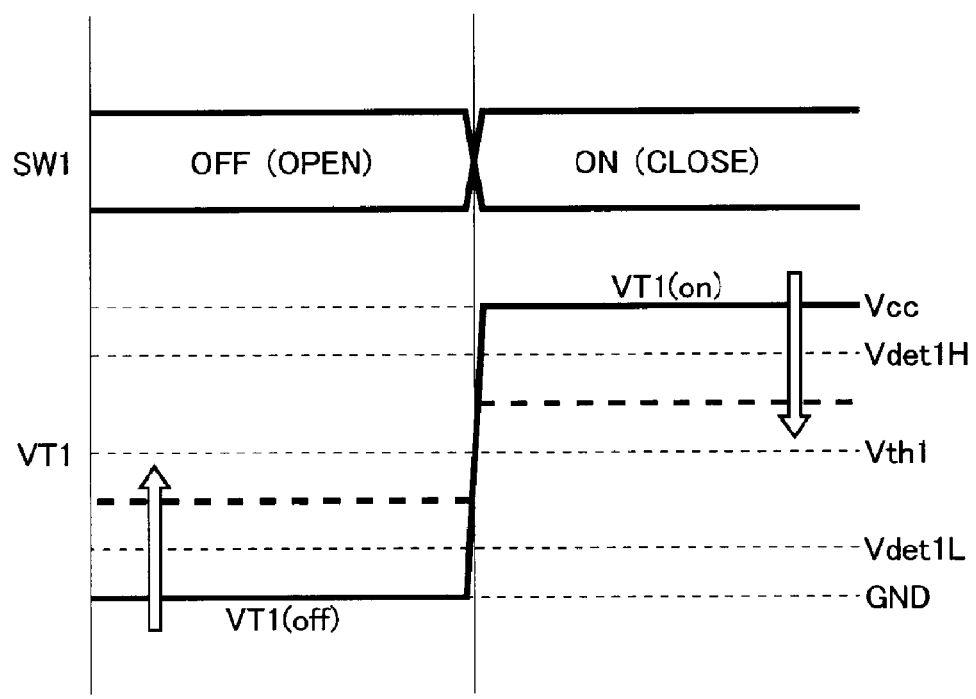
FIG. 16 is a schematic diagram illustrating an operation of determining a state of a power source side switch in a third embodiment of the present disclosure.

FIG. 16 is a schematic diagram illustrating an operation of determining a state of the switch SW1 in a third embodiment of the present disclosure. In FIG. 16, an ON/OFF state of the switch SW1 is illustrated in the upper part, and a behavior of the terminal voltage VT1 is illustrated in the lower part.

An operation of determining the ON/OFF state of the switch SW1 is similar to those of the first embodiment (FIG. 6) and the second embodiment (FIG. 11) described above and thus redundant descriptions thereof will be omitted. Hereinafter, an operation of determining a level of the terminal voltage VT1 will be described.

In this embodiment, a level of the terminal voltage VT1 is determined by combining the first embodiment (FIG. 6) and the second embodiment (FIG. 11). That is to say, when the switch SW1 is turned on, a level of the terminal voltage VT1 is determined by comparing the terminal voltage value VT1 (on) with an abnormality detection value Vdet1H, and when the switch SW1 is turned off, a level of the terminal voltage VT1 is determined by comparing the terminal voltage value VT1 (off) with an abnormality detection value Vdet1L.

When there is no abnormality in the switch SW1, VT1 (on>)>Vdet1H and VT1 (off>)<Vdet1L (see the thick solid line in the drawing). On the other hand, when an abnormality occurs in the switch SW1, VT1 (on>)<Vdet1H or VT1 (off>)>Vdet1L. The reason for this is as described above.

Thus, it is possible to determine a level of the terminal voltage VT1 by comparing the terminal voltage value VT1 (on) with the abnormality detection value Vdet1H and the terminal voltage value VT1 (off) with the abnormality detection value Vdet1L, respectively, regardless of the ON/OFF state of the switch SW1 (abnormality determination).

Figure 17:
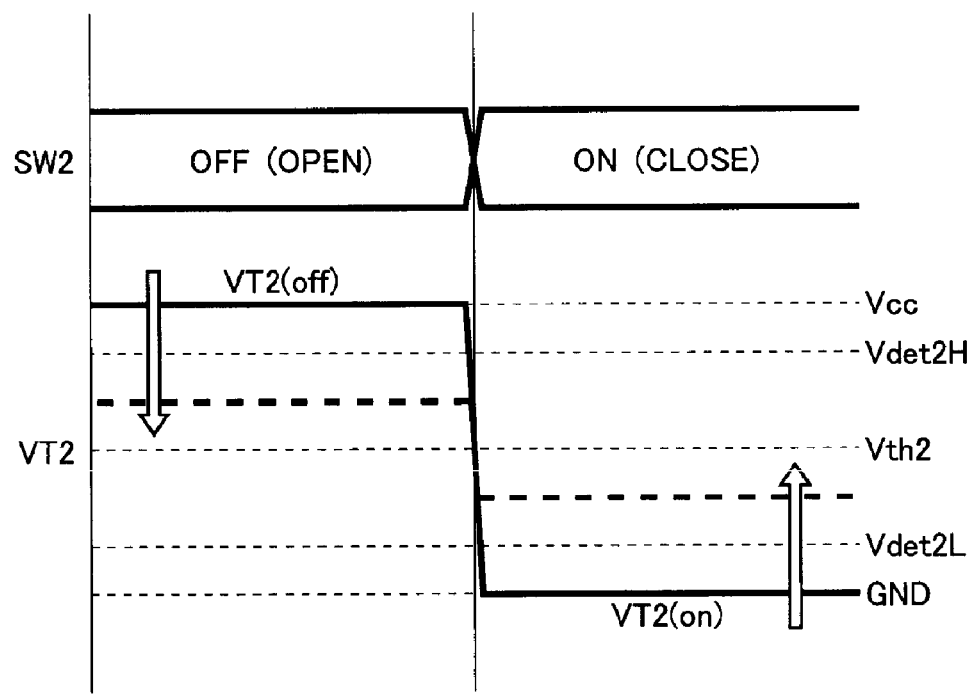
FIG. 17 is a schematic diagram illustrating an operation of determining a state of a GND side switch in the third embodiment.

FIG. 17 is a schematic diagram illustrating an operation of determining a state of the switch SW2 in the third embodiment. In FIG. 17, an ON/OFF state of the switch SW2 is illustrated in the upper part, and a behavior of the terminal voltage VT2 is illustrated in the lower part.

An operation of determining ON/OFF of the switch SW2 is similar to those of the first embodiment (FIG. 7) and the second embodiment (FIG. 12) and thus redundant descriptions thereof will be omitted. Hereinafter, an operation of determining a level of the terminal voltage VT2 will be described.

In this embodiment, a level of the terminal voltage VT2 is determined by combining the first embodiment (FIG. 7) and the second embodiment (FIG. 12). That is to say, when the switch SW2 is turned on, a level of the terminal voltage VT2 is determined by comparing the terminal voltage VT2 (on) with an abnormality detection voltage Vdet2L, and when the switch SW2 is turned off, a level of the terminal voltage VT2 is determined by comparing the terminal voltage VT2 (*off*) with an abnormality detection voltage Vdet2H.

When there is no abnormality in the switch SW2, VT2 (on)<Vdet2L and VT2 (off)>Vdet2H (see the thick solid line in the drawing). On the other hand, when an abnormality occurs in the switch SW2, VT2 (on)>Vdet2L or VT2 (*off*) <Vdet2H. The reason for this is as described above.

Thus, it is possible to determine a level of the terminal voltage VT2 by comparing the terminal voltage value VT2 (on) with the abnormality detection value Vdet2L and the terminal voltage value VT2 (*off*) with the abnormality detection value Vdet2H, respectively, regardless of the ON/OFF state of the switch SW2 (abnormality determination).

Figure 18:
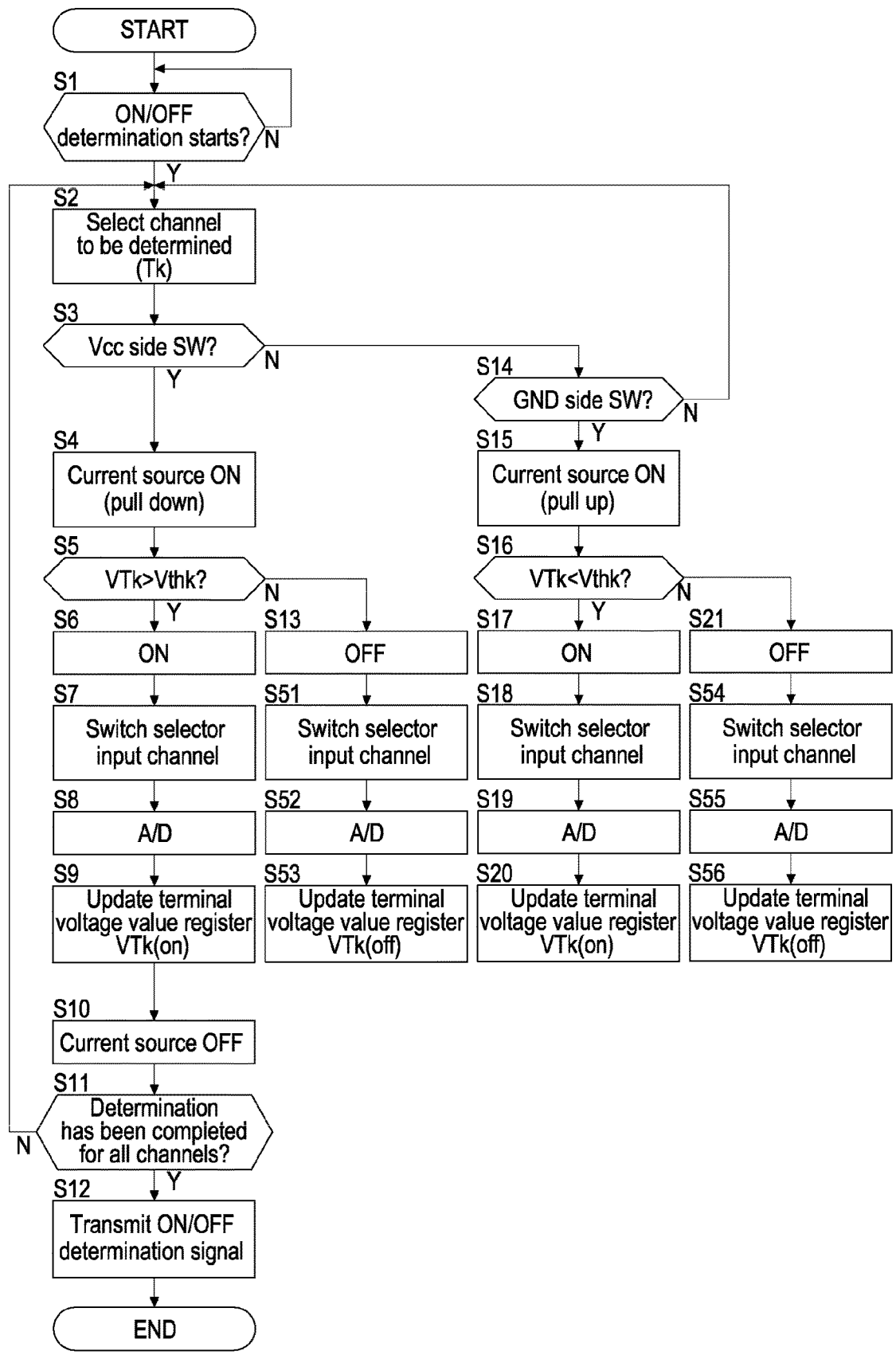
FIG. 18 is a flowchart illustrating an ON/OFF determining operation in the third embodiment.

FIG. 18 is a flowchart illustrating an ON/OFF determining operation in the third embodiment. The flowchart of FIG. 18 is a combination of the flowchart of FIG. 8 and the flowchart of FIG. 13 and characterized in that it includes both the register update processing when a switch is turned on (steps S7 to S9 and step S18 to S20) and the register update processing when a switch is turned off (steps S51 to S56). Since the operation of each step is as described above, redundant operations thereof will be omitted.

Figure 19:
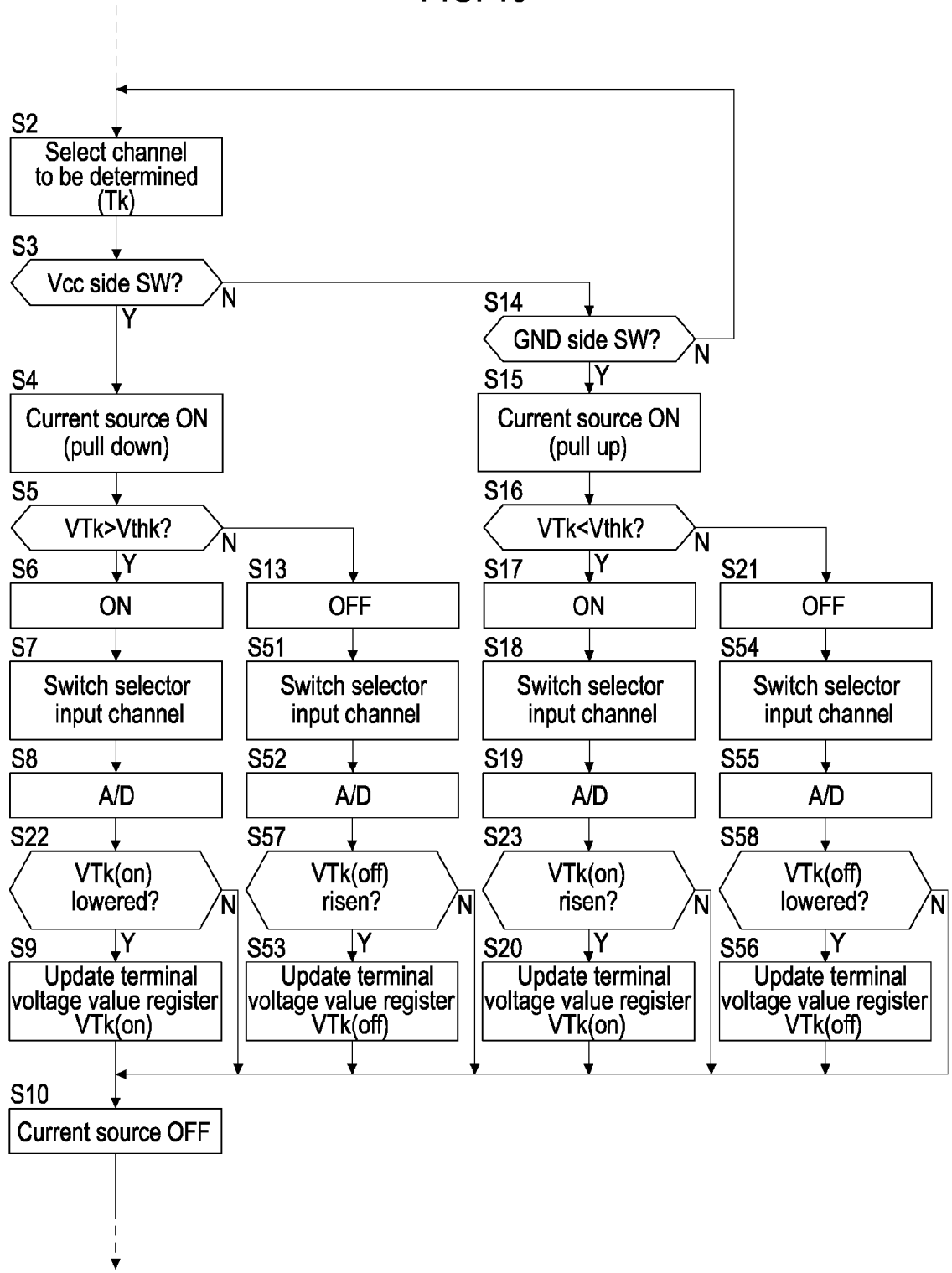
FIG. 19 is a flowchart illustrating a modification of a register updating operation in the third embodiment.

FIG. 19 is a flowchart illustrating a modification of a register updating operation in the third embodiment. The flowchart of FIG. 19 is a combination of the flowchart of FIG. 9 and the flowchart of FIG. 14 and characterized in that it further includes the process of comparing a new terminal voltage value VTk (on) and an old terminal voltage value VTk (on) (steps S22 and S23) and the processing of comparing a new terminal voltage VTk (off) and an old terminal voltage VTk (off) (steps S57 and S58), when compared with the flowchart of FIG. 18. Since the operation of each step is as described above, redundant operations thereof will be omitted.

Figure 20:
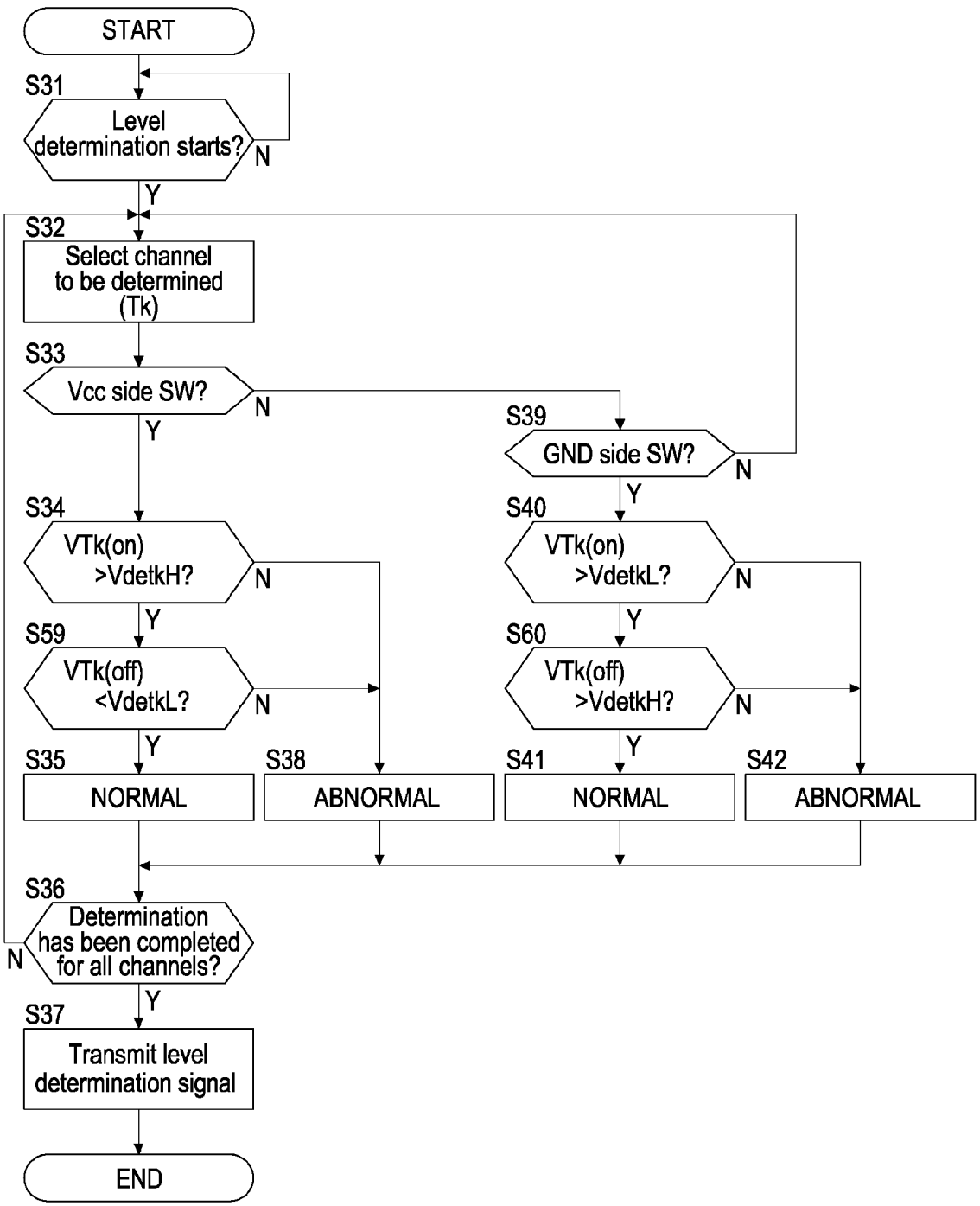
FIG. 20 is a flowchart illustrating a level determining operation in the third embodiment.

FIG. 20 is a flowchart illustrating a level determining operation in the third embodiment. The flowchart of FIG. 20 is a combination of the flowchart of FIG. 10 and the flowchart of FIG. 15 and characterized in that it includes both the process of determining a level when a switch is turned on (steps S34 and S40) and the process of determining a level when a switch is turned off (steps S59 and S60).

For example, when the Vcc side switch is externally attached to the external terminal Tk, in the case of YES at both steps S34 and S59, the flow proceeds to step S35 where a level determination result indicating that the terminal voltage VTk is normal is obtained. On the other hand, in the case of NO at one of steps S34 and S59, the flow proceeds to step S38 where a level determination result indicating that the terminal voltage VTk is not normal (i.e., abnormal) is obtained.

Further, when the GND side switch is externally attached to the external terminal Tk, in the case of YES at both steps S40 and S60, the flow proceeds to step S41 where a level determination result indicating that the terminal voltage VTk is normal is obtained. On the other hand, in the case of NO at one of steps S40 and S60, the flow proceeds to step S42 where a level determination result indicating that the terminal voltage VTk is not normal (i.e., abnormal) is obtained.

In addition, when the terminal voltage value VTk (off) is not obtained, YES may be unconditionally determined at steps S59 and S60. In this case, the flowchart of FIG. 20 is equivalent to the flowchart of FIG. 10. Further, when the terminal voltage value VTk (on) is not obtained, YES may be unconditionally determined at steps S34 and S40. In this case, the flowchart of FIG. 20 is equivalent to the flowchart of FIG. 15.

<Register Resetting Method>

Figure 21:
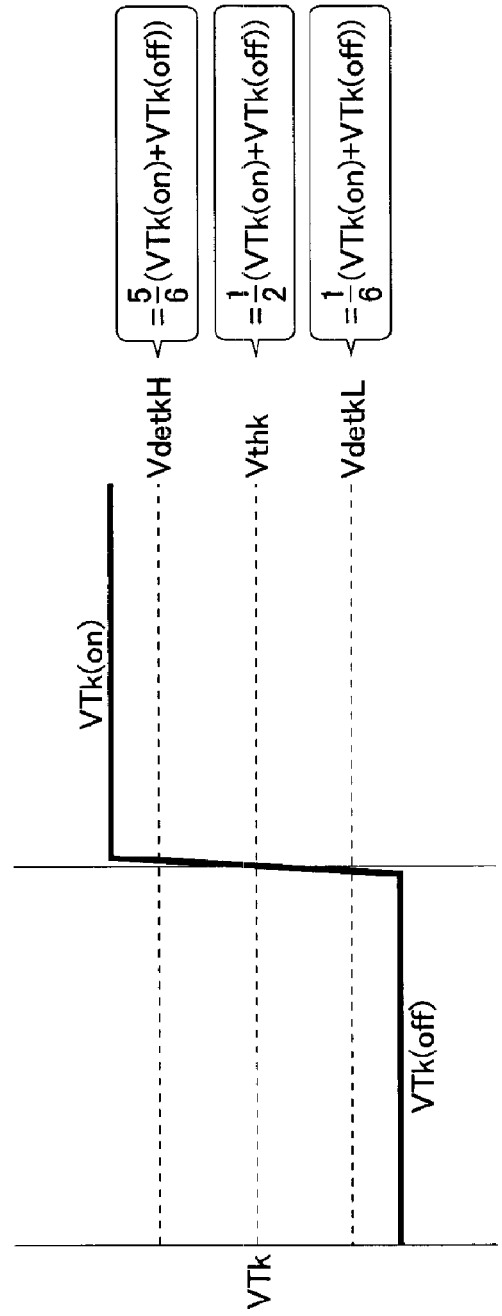
FIG. 21 is a schematic diagram illustrating a register resetting method.

FIG. 21 is a schematic diagram illustrating a method of resetting the threshold voltage set value register 42 and abnormality detection value register 54. In the above, it has been described that the threshold voltage Vthk and the abnormality detection values VdetkH and VdetkL are changed stepwise when it is determined that the terminal voltage VTk is not within a normal range.

However, the method of resetting the threshold voltage set value register 42 and the abnormality detection value register 54 is not limited thereto, and the threshold voltage Vthk and the abnormality detection values VdetkH and VdetkL may be calculated based on both the terminal voltage values VTk (on) and VTk (off).

For example, the threshold voltage Vthk may be calculated as an average value $(=(\frac{1}{2})\times(VTk(on)+VTk(off))$ of the terminal voltage values VTk (on) and VTk (off).

Further, the abnormality detection value VdetkH may be calculated as a value (e.g., VdetkH=$(\frac{5}{6})\times$(VTk(on)+VTk (off))) higher than the threshold voltage Vthk.

Also, the abnormality detection value VdetkL may be calculated as a value (e.g., VdetkL=$(\frac{1}{6})\times$(VTk(on)+VTk (off))) lower than the threshold voltage Vthk.

By performing this calculation, it is possible to properly perform ON/OFF determination of the switch SWk and level determination (abnormality determination) of the terminal voltage VTk without depending on the change patterns of the terminal voltage values VTk (on) and VTk (off).

In addition, although FIG. 21 illustrates the case where the Vcc side switch is externally attached to the external terminal Tk, it is possible to calculate appropriate threshold voltage Vthk and abnormality detection values VdetkH and VdetkL through the same calculation as described above, even when the GND side switch is externally attached to the external terminal Tk.

<Applications to Vehicle>

Figure 22:
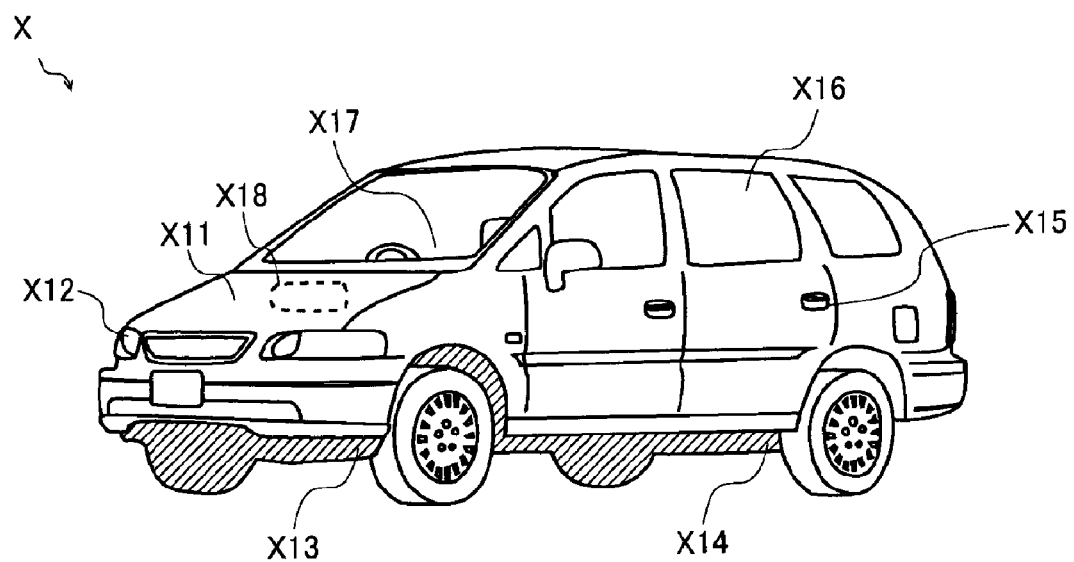
FIG. 22 is an external view illustrating a configuration example of a vehicle.

FIG. 22 is an external view illustrating a configuration example of a vehicle X. The vehicle X of this configuration example is equipped with various electronic devices X11 to X18 that operate by receiving a source voltage Vcc supplied from a battery (not shown). Further, the mounting positions of the electronic devices X11 to X18 in FIG. 22 may be different from the actual positions for the convenience of illustration.

The electronic device X11 is an engine control unit that performs engine-related controls (injection control, electronic throttle control, idling control, oxygen sensor heater control, and auto-cruise control, etc.).

The electronic device X12 is a lamp control unit that controls functions such as turning on or off a high intensity discharged lamp (HID) or a daytime running lamp (DRL).

The electronic device X13 is a transmission control unit that performs transmission-related control.

The electronic device X14 performs movement-related controls of the vehicle X (anti-lock brake system (ABS) control, electric power steering (EPS) control, electronic suspension control, etc.).

The electronic device X15 is a security control unit that controls functions for driving doorlocks, anti-crime alarm, or the like.

The electronic device X16 is an electronic device such as a standard accessory or a maker optional item, such as a wiper, an electrically-controlled door mirror, a power window, a damper (shock absorber), an electrically-controlled sunroof, an electrically-controlled seat, or the like, which is incorporated in the vehicle X when released from a factory.

The electronic device X17 is an electronic device such as a user optional product, such as a vehicle-mounted audio/visual (A/V) system, an automobile navigation system, an electronic toll collection system (ETC) or the like, which is arbitrarily incorporated in the vehicle X.

The electronic device X18 is an electronic device having a high-voltage motor, such as a vehicle-mounted blower, an oil pump, a water pump, a battery cooling fan, or the like.

The switch state determining device 1 described above may also be integrated into any of the electronic devices X11 to X18. That is to say, each of the electronic devices X11 to X18 may be a specific example of the electronic device 100 described above.

(Other Modifications)

Further, various technical features disclosed herein may be differently modified, in addition to the aforementioned embodiments, without departing from the spirit of the technical creation of the present disclosure. That is, the aforementioned embodiments are merely illustrative in all aspects and should not be understood as limiting. The technical scope of the present disclosure is presented by the accompanying claims, rather than by the description of the embodiments, and thus intended to include all modifications that are within the meaning and scope of the accompanying claims and their equivalents.

The switch state determining device disclosed herein can be suitably used as, for example, a means for determining ON/OFF of various switches mounted in a vehicle.

According to the present disclosure in some embodiments, it is possible to provide a switch state determining device which rarely makes erroneous determination due to aged deterioration.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A switch state determining device, comprising:
   an external terminal to which a switch is externally attached;
   a constant current generator configured to generate a constant current and flow the constant current through the external terminal, and including:
      a first current source connected between the external terminal and a power source terminal; and
      a second current source connected between the external terminal and a ground terminal;
   a voltage comparator configured to compare a terminal voltage of the external terminal with a threshold voltage to generate a comparison signal that indicates whether or not the terminal voltage is higher than the threshold voltage;
   a threshold voltage controller configured to adjust the threshold voltage depending on a threshold voltage set value; and
   a level determiner including:
      an abnormality detection value register configured to store an abnormality detection value to be compared with a terminal voltage value; and
      a comparator configured to compare the terminal voltage value with the abnormality detection value to generate a level determination signal,
   wherein the threshold voltage set value is reset depending on the level determination signal,
   wherein the abnormality detection value is set to be between the threshold voltage and a source voltage,
   wherein if the level determiner determines that the terminal voltage value is smaller than the abnormality detection value, the abnormality detection value is stepped down, and
   wherein the first current source is driven when an ON/OFF determination of a switch externally attached between the external terminal and the ground terminal is performed and the second current source is driven when an ON/OFF determination of a switch externally connected between the external terminal and the power source terminal is performed.

2. The device of claim 1, wherein the level determiner comprises:
   an analog-to-digital (A/D) converter configured to convert the terminal voltage into the terminal voltage value; and
   a terminal voltage value register configured to store the terminal voltage value.

3. The device of claim 2, wherein the level determiner further comprises a selector configured to select one terminal voltage from a plurality of external terminals and output the selected terminal voltage to the A/D converter.

4. An electronic device, comprising:
   a switch; and
   the switch state determining device of claim 2,
   wherein both the threshold voltage set value and the abnormality detection value are calculated depending on the terminal voltage value.

5. An electronic device, comprising:
   switch state determining device of claim 1; and
   the switch.

6. The electronic device of claim 5, wherein the threshold voltage set value is calculated depending on the terminal voltage value.

7. A vehicle comprising the electronic device of claim 5.

8. The device of claim 1, wherein the level determiner is configured to output the level determination signal or the terminal voltage value in response to a request.

9. The device of claim 1, wherein the level determiner is configured to autonomously output the level determination signal or the terminal voltage value.

10. A switch state determining device, comprising:
    an external terminal to which a switch is externally attached;
    a constant current generator configured to generate a constant current and flow the constant current through the external terminal, and including:
       a first current source connected between the external terminal and a power source terminal; and
       a second current source connected between the external terminal and a ground terminal;
    a voltage comparator configured to compare a terminal voltage of the external terminal with a threshold voltage to generate a comparison signal that indicates whether or not the terminal voltage is higher than the threshold voltage;
    a threshold voltage controller configured to adjust the threshold voltage depending on a threshold voltage set value; and a level determiner including:
- an abnormality detection value register configured to store an abnormality detection value to be compared with a terminal voltage value; and
- a comparator configured to compare the terminal voltage value with the abnormality detection value to generate a level determination signal, wherein the threshold voltage set value is reset depending on the level determination signal, wherein the abnormality detection value is set to be between the threshold voltage and a ground voltage, wherein if the level determiner determines that the terminal voltage value is larger than the abnormality detection value, the abnormality detection value is stepped up, and wherein the first current source is driven when an ON/OFF determination of a switch externally attached between the external terminal and the ground terminal is performed and the second current source is driven when an ON/OFF determination of a switch externally connected between the external terminal and the power source terminal is performed.

11. The device of claim 10, wherein the level determiner comprises:
- an analog-to-digital (A/D) converter configured to convert the terminal voltage into the terminal voltage value; and
- a terminal voltage value register configured to store the terminal voltage value.

12. The device of claim 11, wherein the level determiner further comprises a selector configured to select one terminal voltage from a plurality of external terminals and output the selected terminal voltage to the A/D converter.

13. An electronic device, comprising:
a switch; and
the switch state determining device of claim 11,
wherein both the threshold voltage set value and the abnormality detection value are calculated depending on the terminal voltage value.

14. An electronic device, comprising:
switch state determining device of claim 10; and
the switch.

15. The electronic device of claim 14, wherein the threshold voltage set value is calculated depending on the terminal voltage value.

16. A vehicle comprising the electronic device of claim 14.

17. The device of claim 10, wherein the level determiner is configured to output the level determination signal or the terminal voltage value in response to a request.

18. The device of claim 10, wherein the level determiner is configured to autonomously output the level determination signal or the terminal voltage value.

* * * * *